United States Patent [19]

Matsuoka et al.

[11] Patent Number: 5,555,247
[45] Date of Patent: Sep. 10, 1996

[54] FRAME SYNCHRONIZING APPARATUS FOR QUADRATURE MODULATION DATA COMMUNICATION RADIO RECEIVER

[75] Inventors: Akihiko Matsuoka; Hiroshi Ohnishi, both of Tokyo; Yoshinori Kunieda; Kouei Misaizu, both of Kawasaki; Yuuri Yamamoto, Yokohama, all of Japan

[73] Assignee: Matsushita Electric Industrial Co., Ltd., Osaka, Japan

[21] Appl. No.: 515,607

[22] Filed: Aug. 16, 1995

Related U.S. Application Data

[62] Division of Ser. No. 200,592, Feb. 23, 1994, Pat. No. 5,463,627.

[30] Foreign Application Priority Data

Feb. 26, 1993 [JP] Japan ................................. 5-037641
Feb. 23, 1995 [JP] Japan ................................. 7-033072

[51] Int. Cl.$^6$ .................................................. H04J 3/06
[52] U.S. Cl. ........................ 370/105.1; 375/355; 375/362
[58] Field of Search ........................... 370/100.1, 105.1, 370/105.2, 105.4, 106; 375/332, 340, 343, 342, 362, 364, 365, 366, 368, 355, 298, 280, 235, 371, 367; 327/7, 9, 23, 22, 27

[56] References Cited

U.S. PATENT DOCUMENTS

| | | | |
|---|---|---|---|
| 4,038,540 | 7/1977 | Roberts | 375/343 |
| 4,071,821 | 1/1978 | Harthill et al. | 375/332 |
| 4,599,732 | 7/1986 | LeFever | 375/355 |
| 4,768,208 | 8/1988 | Cornett | 375/355 |
| 4,805,191 | 2/1989 | Burch et al. | 375/355 |
| 4,847,869 | 7/1989 | Labedz | 375/365 |
| 5,228,036 | 7/1993 | Okamoto et al. | 370/105.1 |
| 5,422,917 | 6/1995 | Scott | 375/371 |

FOREIGN PATENT DOCUMENTS

4-286235  10/1992  Japan.

OTHER PUBLICATIONS

"Fast Adaptive Equalizers For Narrow–Band TDMA Mobile Radio" by D'Aria et al.; IEEE Transactions Of Vehicular Technology, vol. 40, No. 2, May 1991; pp. 392–404.

*Primary Examiner*—Wellington Chin
*Assistant Examiner*—Huy D. Vu
*Attorney, Agent, or Firm*—Lowe, Price, LeBlanc & Becker

[57] ABSTRACT

In a frame synchronizing apparatus for a receiver apparatus of a digital data radio communications system in which data are transmitted in frame periods with a fixed data sequence contained each frame, a data correlation circuit obtains successive sequences of values of vector difference between vector values constituting a demodulated digital baseband signal, and successively compares these sequences with a fixed vector difference sequence corresponding to the fixed data sequence, to derive a correlation signal substantially unaffected by any phase rotation in the baseband signal. A frame synchronizing circuit formed as a PLL for generating a frame synchronizing signal, includes a phase comparator which periodically indicates whether a detected phase difference between the correlation signal and frame synchronizing signal is effectively zero, positive or negative, and a counter holding a count value indicating a cumulative phase error between these signals. So long as the detected phase differences are successively effectively zero and the cumulative phase error is sufficiently small, the phase of the frame synchronizing signal is held unchanged, thereby achieving a high degree of phase stability.

15 Claims, 16 Drawing Sheets

5,555,247

FRAME SYNCHRONIZING APPARATUS FOR QUADRATURE MODULATION DATA COMMUNICATION RADIO RECEIVER

This application is a division of application Ser. No. 08/200,592 filed Feb. 23, 1994 now U.S. Pat. No. 5,463,627.

BACKGROUND OF THE INVENTION

1. Field of the Invention

The present invention relates to an apparatus for deriving a frame correlation signal, and a frame synchronizing signal based on the frame correlation signal, for use in a digital radio receiving apparatus employing non-synchronous detection operation, in a radio data communication system.

2. Description of Related Art

In recent years, considerable research and development has been performed on radio communications systems for digital data communication. Typically, such a system employs multiplex operation, in which data communications is implemented using time-sharing by a number of users. Data are transmitted by quadrature modulation of a carrier, with the data being converted into a sequence of symbols each expressed as a vector, and corresponding quadrature baseband signals are recovered in each radio receiver apparatus by demodulating the received carrier using a local oscillator signal. The originally transmitted data are then recovered after periodically sampling the demodulated quadrature baseband symbols at timings corresponding to the symbol timings, to extract the successive symbols. The various problems which are presented by such a TDMA (time division multiple access) system when applied to mobile communications are discussed for example in an article "Fast Adaptive Equalizers for Narrow-Band TDMA Mobile Radio" by G. D'Aria, R Piermarini and V. Zingarelli, IEEE Trans. Veh. Technol., vol 40, No. 2, May 1991, pp 392–404. With such a system, it is basically necessary for each radio receiver of the system to accurately define the symbol timings of the received data, and also the timings of successive frames of that data. To enable generation reference and control signals for implementing these functions in each radio receiving apparatus, each data frame includes a known, fixed sequence of data referred to as a preamble (if located at the start of each frame), or a "midamble" if located centrally within each frame. If occurrences of these sequences are accurately detected in the receiving apparatus, then a frame (reference) synchronizing signal for defining successive frame intervals, and a symbol timing reference signal for extracting the symbols from the demodulated quadrature baseband signals, can be generated. In the following, a symbol sequence corresponding to the fixed data sequence will be referred to as the known symbol sequence.

One type of frame synchronizing apparatus for such applications utilizes a digital phase-locked loop (PLL) that uses as a phase reference signal a correlation signal, derived by detecting occurrences of the known symbol sequence (or the fixed data sequence itself, contained in the finally recovered data), to derive a frame synchronizing signal. A prior art example of such a frame synchronizing apparatus will be described referring to the block diagram of FIG. 1, in which numeral 41 denotes a pair of demodulated quadrature baseband signals. These are respective analog signals, consisting of an I (in-phase) and Q (quadrature) signal which in combination represent successive symbols, and are derived by demodulating a received quadrature modulation radio signal by a radio receiving circuit (not shown in the drawing). Numeral 42 denotes a data demodulation section, in which A/D conversion of these (analog) quadrature baseband signals is executed, to obtain a corresponding pair of digital quadrature baseband signals 43. Each of these signals, consisting of a train of digital sample values, is obtained by sampling the corresponding one of the I, Q analog quadrature baseband signals at a sampling rate which is higher than the symbol rate of the aforementioned symbols, i.e. oversampling of the symbols occurs.

In the example of FIG. 1, the digital quadrature baseband signal 43 is sent to a correlation signal generating section 44, for use in deriving a correlation signal 45, by detecting the known symbol sequence. The correlation signal 45 will in generally be obtained as a binary signal, e.g. which is normally at the L logic level, and attains the H logic level each time the known symbol sequence is detected. The correlation signal 45 is supplied to a frame synchronizing section 46, to be used in generating a frame synchronizing signal 47 which specifies the starting points of successive frame intervals, and may also be used in deriving a symbol timing reference signal which specifies the timings of the appropriate digital samples (in the symbol intervals of the received data) to be selected from the quadrature baseband signals 43 for use in extracting the transmitted data. These synchronizing and reference signals are sent to the data demodulation section 42, which thereby derives the originally transmitted data as the demodulated data signal 48.

As mentioned above, it is also possible to derive the correlation signal based upon detecting correlation with the fixed data sequence itself.

An example of a prior art type of configuration for the frame synchronizing section 46, utilizing a digital PLL, will be described referring to the block diagram of FIG. 2. In FIG. 2, numeral 45 denotes the correlation signal, and 47 denotes the frame synchronizing signal that is sent to the data demodulation section 42 in FIG. 1. 52 denotes a phase comparison section, which compares the phases of the correlation signal 45 and the frame synchronizing signal 47, to produce an output signal 53 expressing the amount of phase difference between these signals. A phase error counter 54 accumulates successive values of the phase error signal 53, and outputs a signal 55 expressing a value of cumulative phase error that is represented by the current count value of the phase error counter 54, which is sent to a phase error judgement section 56. The phase error judgement section 56 judges the value of the cumulative phase error signal 56, and produces a reset signal 57 and a frame phase error signal 62 in accordance with the judgement result. The frame phase error signal 62 is supplied to a phase control section 61, which outputs a phase control signal 60 based upon the frame phase error signal 62. The phase control signal 60 is supplied to a frame signal generating section 59, which generates the frame synchronizing signal 47 based on the phase control signal 60.

The operation of the frame synchronizing section 46 of such a prior art frame synchronizing apparatus is as follows. The phase comparison section 52 periodically (i.e. when the level of the correlation signal 45 exceeds a predetermined threshold value, once in each frame interval) compares the respective phases of the frame synchronizing signal 47 and the correlation signal 45. If the correlation signal 45 is found to be advanced in phase, then the phase error signal 53 is generated such as to increment the count held in the phase error counter 54 by a fixed amount, whereas if the correlation signal 45 is found to be delayed with respect to the current frame synchronizing signal 47, the cumulative phase error count held in the phase error counter 54 is decremented by that fixed amount. The phase error judgement section 56 interprets the cumulative phase error value as expressing either a positive or a negative value, and judges whether the absolute value of that cumulative phase error has exceeded a preset value. If that preset value is exceeded, then the phase error judgement section 56 generates the reset signal 57 to reset the phase error counter 54, and, if in that condition the sign of the cumulative phase error 55 is positive, the phase error judgement section 56 generates the frame phase error signal 62 with a value of +1, whereas if the absolute value of the cumulative phase error 55 exceeds the preset value and is negative, then the phase error judgement section 56 generates the frame phase error signal 62 with the value −1. If the frame phase error signal 62 takes the value +1 then the phase control section 61 generates the phase control signal 60 such as to control the frame signal generating section 59 to advance the phase of the frame synchronizing signal 47 by one unit, whereas if the frame phase error signal 62 is −1 then the phase of the frame synchronizing signal 47 is delayed by one unit.

However with such a prior art system, due to the fact that the count value held in the phase error counter is always changed each time that a comparison is executed between the phases of the locally generated frame synchronizing signal and the current frame synchronizing signal (even if the phase error is effectively zero), the phase error between the locally generated frame synchronizing signal and the current frame synchronizing signal varies continuously, with the amount of variation being equal to the period of an operating clock signal (not shown in the drawing) which controls the operation timings of the phase comparator section 52 and frame signal generating section 59, i.e. with the amount of variation being determined by the minimum unit of time used in controlling the phase of the frame synchronizing signal. That minimum time unit is identical to the sampling period of the digital samples into which the (analog) quadrature baseband signal of the system is converted, by A/D conversion. Various other timing and lower-frequency clock signals are derived from the operating clock signal.

Thus with such a prior art system, since the phase error of the frame synchronizing signal is constantly varying as described above, the period of the operating clock signal must be made sufficiently long to ensure that a sufficient degree of phase stability is maintained for the frame synchronizing signal. However this will in general conflict with other design requirements, and so presents a significant problem.

Problems also exist with prior types of apparatus for deriving a correlation signal based on the aforementioned known data sequence which occurs at a fixed position in each frame interval. FIG. 3 shows an example of such a prior art apparatus, in which the correlation signal is derived based on the known symbol sequence periodically occurring in the (analog) baseband signals. In FIG. 3, 92 denotes a data register which outputs a vector value sequence that expresses such a known symbol sequence. The term "vector value" will be used herein to designate a concurrent pair of digital values obtained as a sample of a pair of quadrature baseband signals, i.e. digital values respectively expressing the real and imaginary components of a signal vector in the complex plane. A vector correlation section 93 includes a shift register into which successive received vector values (i.e. of the digital quadrature baseband signals 90) are sequentially shifted, with the number of output vector values extracted in parallel from the shift register being equal to the number of symbols in the known symbol sequence. As a result, successive sequences of received vector values are outputted in parallel from the register 92. The vector correlation section 93 functions to obtain, for each of these sequences of received vector values, the degree of correlation with the known symbol sequence, as a set of correlation values which are supplied to an adder 95. The adder 95 obtains the sum of these correlation values, to produce a correlation signal 45.

However with such a prior art type of correlation derivation apparatus, there are conflicting requirements for obtaining a satisfactory correlation signal. Specifically, the length of the known symbol sequence should be as long as possible, to minimize the effects of noise on the correlation signal and maximize the amplitude variation of the correlation signal. However the longer the sequence, the greater will be an amount of phase rotation within each sequence of vector values extracted from the quadrature baseband signals. This is a phase rotation which results from a frequency offset of the local oscillator signal used in the radio receiving apparatus. Such phase rotation results in a decrease in the phase accuracy of the correlation signal, with that adverse effect being increased if the number of vector values constituting the known symbol sequence is increased. Thus, if the amount of carrier frequency offset is large, it becomes difficult to use a sufficiently long symbol sequence to obtain a satisfactory variation in amplitude of the correlation signal.

SUMMARY OF THE INVENTION

It is a first objective of the present invention to overcome the problems described above by providing a frame synchronizing apparatus which includes a frame synchronizing circuit formed of a digital phase locked loop circuit, for generating a frame synchronizing signal with an improved degree of stability, for use in a radio receiver apparatus of a digital radio communication system.

It is a second objective of the invention to provide such a frame synchronizing apparatus with a data correlation circuit for generating a correlation signal defining successive frame periods of the received data, to serve as a phase reference signal of the digital phase locked loop, wherein the phase accuracy of the correlation signal is not substantially affected by a phase rotation of vector values constituting a digital baseband signal, which results from a frequency offset of the local oscillator signal.

With regard to the first objective described above, to achieve a sufficient degree of phase stability of the frame synchronizing signal, the frame synchronizing circuit comprises phase comparison means for periodically obtaining a phase detection value which selectively indicates whether a phase error between frame synchronizing signal and the correlation signal which is utilized as a phase reference signal for generating the frame synchronizing signal, is positive, negative, or zero. The frame synchronizing circuit further comprises a phase error counter which stores a count value indicating a cumulative amount of that phase error, and means for adjusting the phase of the frame synchronizing signal only if the absolute magnitude of the cumulative phase error is above a predetermined threshold value. In each of successive frame periods in which the detected phase error is zero and the cumulative phase error is below the aforementioned limit, the phase of the frame synchronizing signal is held fixed, and the count in the phase error counter is successively reduced. In a condition in which that count is zero, i.e. the cumulative phase error is zero, and in which the detected phase error values are successively zero, the cumulative error value is left continuously unchanged, and so remains below the aforementioned threshold absolute value.

As a result, a higher degree of phase stability is achieved for the frame synchronizing signal than is possible with prior art types of frame synchronizing circuit which can only detect, in each phase comparison operation, whether the phase error between the correlation signal and frame synchronizing signal is positive or negative, and cannot judge that the condition of zero phase error occurs. With such a prior art type of frame synchronizing circuit, the contents of the phase error counter are continuously changing, even in a condition in which there is no measurable phase error detected between the correlation signal and the frame synchronizing signal in successive phase comparison operations. The phase of the frame synchronizing signal thus cannot be held stable. However that problem is eliminated with a frame synchronizing circuit according to the present invention.

With regard to the second objective set out above, a data correlation circuit according to the present invention overcomes the disadvantages of a prior art type of data correlation circuit by having means for achieving the following basic operation. Successive sequences of received vector difference values are derived from the stream of received vector values which constitute the digital quadrature baseband signals produced in the radio receiving apparatus. Each received vector difference value is obtained between two successive vector values which are separated by an amount equal to one symbol period, in the received data stream. A fixed sequence of known vector difference values, respectively mutually separated by an amount equal to one symbol interval, is similarly derived from the known vector value sequence, and each successive sequence of received vector difference values is compared with the sequence of known vector difference values. A correlation signal is thereby derived as a result of these successive comparisons, which varies in amplitude in accordance with the degree of correlation between the received baseband signals and the known vector value sequence, and is thereby synchronized with occurrences of the fixed symbol sequence in the received data stream, but which is substantially free from phase error resulting from phase rotation of the received vector values, caused by a local oscillator frequency offset.

More specifically, according to a first aspect the invention provides a frame synchronizing apparatus for a receiving apparatus of a digital data communications radio system in which data are transmitted as symbols in time-multiplexed frames each including a fixed symbol sequence, the frame synchronizing apparatus including a data correlation circuit for detecting occurrences of the fixed symbol sequence for thereby generating a correlation signal, and a frame synchronizing circuit comprising:

frame synchronizing signal generating circuit means for generating a frame synchronizing signal;

phase comparison means for executing successive phase comparison operations between the correlation signal and frame synchronizing signal to produce corresponding phase detection values for selectively indicating that a detected phase error between the correlation signal and frame synchronizing signal is positive, negative or zero;

phase error counter means for deriving a cumulative count value indicative of a cumulative phase error between the frame synchronizing signal and correlation signal;

counter control circuit means responsive to each of the phase detection values and the cumulative count value, when the detected phase error is indicated as zero and the cumulative phase error is indicated as other than zero, for decrementing the absolute value of the cumulative count value by a fixed amount following each of the phase comparison operations; and error judgement and phase control circuit means coupled to control the frame synchronizing signal generating means, responsive to the cumulative count value for changing the phase of the frame synchronizing signal in a first direction when the cumulative count value exceeds a predetermined absolute magnitude and indicates a first phase error polarity, and in a second direction when the cumulative count value exceeds the predetermined absolute magnitude and indicates a second phase error polarity.

Such a frame synchronizing apparatus can further comprise means which functions during an initial operating condition of the frame synchronizing apparatus in which the phase of the frame synchronizing signal is undefined, for instantaneously setting the frame synchronizing signal in phase with the correlation signal. Rapid attainment of a condition of phase lock between the correlation signal and the frame sync signal can thereby be achieved.

Such a frame synchronizing apparatus can further include means for detecting an excessive phase error condition in which an absolute value of the detected phase error has exceeded a first predetermined threshold value during each of a number of consecutive phase comparison operations and in which the number of consecutive phase comparison operations exceeds a second predetermined threshold value, and means responsive to detection of the excessive phase error condition for instantaneously setting the frame synchronizing signal in phase with the correlation signal. Rapid recovery of phase lock can thereby be achieved, when lock is momentarily lost due to varying radio reception conditions.

According to a second aspect, the invention provides a frame synchronizing apparatus for a receiving apparatus of a digital data communications radio system in which data are transmitted as symbols by quadrature modulation of a carrier, arranged in in time-multiplexed frames each including a fixed symbol sequence, the receiving apparatus including means for demodulating a received radio signal to obtain quadrature baseband signals expressing the symbols, and sampling means for sampling the quadrature baseband signals in successive sample periods to obtain respective received vector values, the frame synchronizing apparatus including a data correlation circuit for producing a correlation signal synchronized with occurrences of the fixed symbol sequence, comprising:

vector difference value generating means for deriving respective received vector difference values between successive pairs of the received vector values, the pairs being mutually separated by one symbol period;

vector normalization means for converting the received vector difference values to respective normalized received vector difference values;

known vector difference value generating means for generating a sequence of normalized known vector difference values, expressing respective vector differences between successive pairs of symbols of the fixed symbol sequence;

shift register means, and means for shifting the normalized received vector difference values into the shift register means in successive ones of the sample periods, with a sequence of of the normalized received vector difference values, respectively mutually separated by an amount equivalent to one symbol period and identical in number to the normalized known vector difference values, being outputted in parallel from the shift register means in each of the sampling periods; and correlation signal derivation means operating on each of the normalized received vector difference value sequences and the known vector difference value sequence to derive respective amplitude values of the correlation signal, the values varying in accordance with a degree of correlation between the normalized received vector difference values and the normalized known vector difference values.

Alternatively, such a data correlation circuit can comprise:

vector difference value generating means responsive to the received vector values for deriving respective received vector difference values between successive pairs of the received vector values, the pairs being each mutually separated by one symbol period, and for outputting in parallel a sequence of the received vector difference values in each of the sample periods;

vector normalization means for converting each of the received vector difference value sequences produced from the vector difference value generating means to a normalized received vector difference value sequence;

known vector difference generating means for generating in parallel a set of normalized vector difference values between successive pairs of symbols of the known symbol sequence, as a normalized known vector difference value sequence; and correlation signal derivation means operating on each of the received vector difference value sequences and the known vector difference value sequence to derive respective amplitude values of the correlation signal.

The correlation signal produced by such a data correlation circuit is preferably converted to binary signal form, by utilizing means for comparing the correlation signal with a predetermined threshold value to obtain a level-detected correlation signal, to be supplied as a phase reference signal of a digital phase locked loop circuit which generates a frame synchronizing signal, i.e. whereby the phase of the frame synchronizing signal will correspond to the average phase of occurrences of the threshold value being exceeded.

According to a third aspect, the invention provides a frame synchronizing apparatus for a receiving apparatus of a digital data communications radio system in which data are transmitted as symbols by quadrature modulation of a carrier, arranged in in time-multiplexed frames each including a fixed symbol sequence, the receiving apparatus including means for demodulating a received radio signal to obtain quadrature baseband signals expressing the symbols, sampling means for sampling the quadrature baseband signals in successive sample periods to obtain respective received vector values, and a data correlation circuit for producing a correlation signal which is synchronized with occurrences of the fixed symbol sequence;

wherein the data correlation circuit comprising vector difference value generating means for deriving respective received vector difference values between successive pairs of the vectors, the pairs being each mutually separated by one symbol period, for converting the received vector difference values to respective normalized received vector difference values and for generating successive sequences of the normalized vector difference values, known vector difference generating means for generating a sequence of normalized known vector difference values, the known vector difference values expressing respective vector differences between successive pairs of symbols of the known symbol sequence, and data correlation means for operating on the received vector difference value sequences and the known vector difference value sequence to derive a correlation signal which is synchronized with occurrences of the fixed symbol sequence;

the frame synchronizing apparatus further includes a frequency offset compensation circuit comprising:

frequency offset estimating means for deriving successive values each expressing an amount and direction of estimated frequency offset of a local oscillator of the radio receiver with respect to a received carrier frequency, by executing calculations each based on the normalized received vector difference value and known vector difference value sequences in conjunction with a precedingly calculated value of the estimated frequency offset; and phase compensation means for for executing respective amounts of phase shift of the received vector values in accordance with the estimated frequency offset, to obtain successive compensated received vector values;

wherein the frequency offset estimating means is controlled by the correlation signal to calculate updated values of the estimated frequency offset only at time points when an amplitude of the correlation signal exceeds a predetermined threshold value.

Alternatively, such a frequency offset compensation circuit comprises:

frequency offset estimating means for deriving a value of estimated frequency offset expressing an amount and direction of an estimated frequency offset of a local oscillator of the radio receiving apparatus with respect to a received carrier frequency, by executing calculations each based on the normalized received vector difference value and known vector difference value sequences in conjunction with a precedingly calculated value of the estimated frequency offset; and local oscillator control signal generating means for generating a local oscillator control signal varying in accordance with the estimated frequency offset value, and means for applying the local oscillator control signal to execute frequency compensation of a local oscillator generating circuit of the receiving apparatus;

the frequency offset estimating means being controlled by the correlation signal to derive updated values of the estimated frequency offset only at time points when an amplitude of the correlation signal exceeds a predetermined threshold value.

According to another aspect, a frame synchronizing apparatus according to the present invention further includes a circuit for deriving a symbol reference timing signal, for use in defining those time points in the received data stream which correspond to the central positions of respective symbol periods, such a circuit comprising:

judgement means for generating level-detected correlation signal pulses defining respective intervals in which the correlation signal exceeds a predetermined threshold value;

means for deriving, for each of the level-detected correlation signal pulses, a number of sample intervals corresponding to the duration of the each level-detected correlation signal pulse;

means for deriving, for each of the level-detected correlation signal pulses, a value which is substantially equal to one half of the number of sample intervals;

loop counter means for periodically counting from a minimum to a maximum count value with a period which is identical to the symbol period, to thereby produce the symbol timing reference signal; and means for presetting the loop counter means, as an initial count value immediately following each of the level-detected correlation signal pulses, to the value which is substantially equal to half of the number of sample intervals.

DESCRIPTION OF PREFERRED EMBODIMENTS

Figure 4:
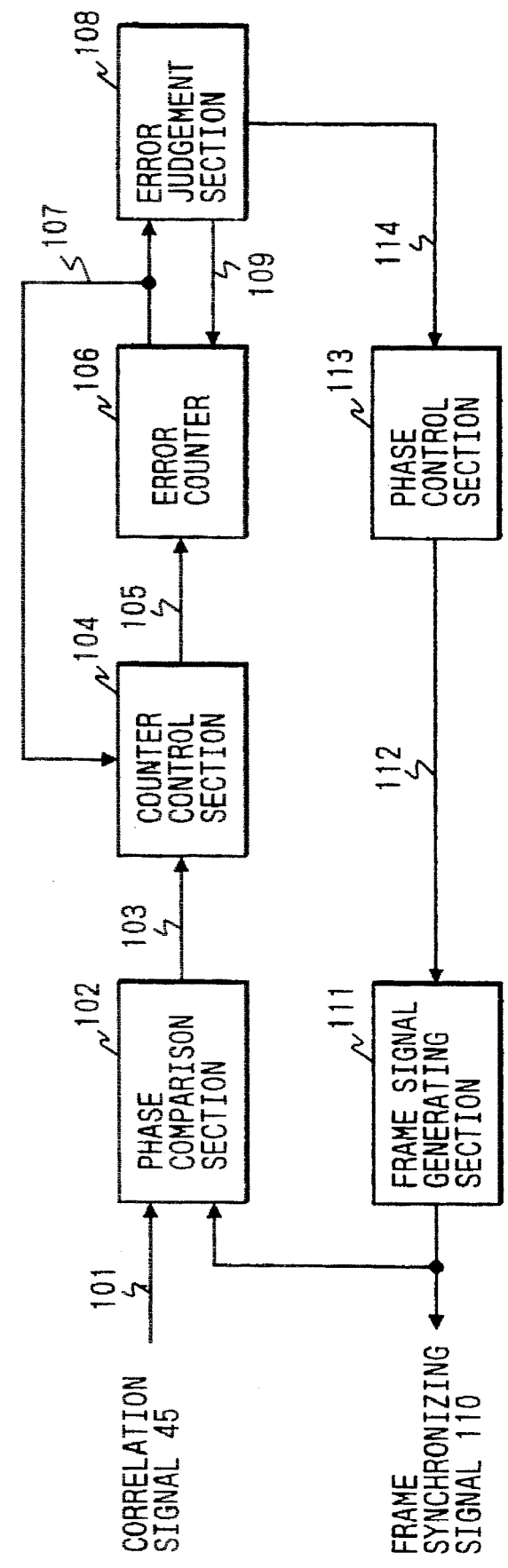
FIG. 4 is a general block system diagram of an embodiment of a frame synchronizing signal generating apparatus according to the present invention, for generating a frame synchronizing signal that is phase-locked with a correlation signal.

A first embodiment of a frame synchronizing apparatus according to the present invention will be described referring to the general block system diagram of FIG. 4. In FIG. 4, numeral 101 denotes a correlation signal which is derived from a received digital communications signal by a data correlation circuit (not shown in the drawing). It will be assumed that under normal receiving conditions, in which the aforementioned known symbol sequence is detected once in each frame interval of the received data, a phase comparison time point (e.g. the leading edge of a correlation signal pulse) is defined by the correlation signal 101 at the start of each frame interval. The correlation signal 101 is supplied to one input of a phase comparator section 102, which compares the phase of the correlation signal 101 with that of a frame synchronizing signal 110 (generated as described hereinafter), and produces a corresponding phase error signal 103 expressing the amount of phase difference as a digital value. The phase error signal 103 is supplied to a counter control section 104, which derives and outputs a count control signal 105 based on the amount of phase error expressed by the phase error signal 103 and on a cumulative phase error value, expressed by a count value 107 that is derived by a phase error counter 106. The count control signal 105 is supplied to the phase error counter 106, and controls whether, at each pulse of the correlation signal 101, the count value 107 is incremented by a fixed amount, decremented by a fixed amount, or left unchanged. The count value 107 is supplied to the counter control section 104 and also to an error judgement section 108. The error judgement section 108 judges the condition of the cumulative phase error, in accordance with the count value 107, and based on that judgement the error judgement section 108 selectively generates a reset signal 109 which is supplied to the phase error counter 106, and a frame phase error signal 114 which is supplied to a phase control section 113. The phase control section 113 produces a control signal 112, which is supplied to control a frame signal generating section 111. The frame signal generating section 111 is controlled by the control signal 112 to generate the frame synchronizing signal 110 such that the period of the frame synchronizing signal 110 is substantially identical to the aforementioned frame period, and that the frame synchronizing signal 110 is held phase-synchronized with the correlation signal 101.

Figure 5:
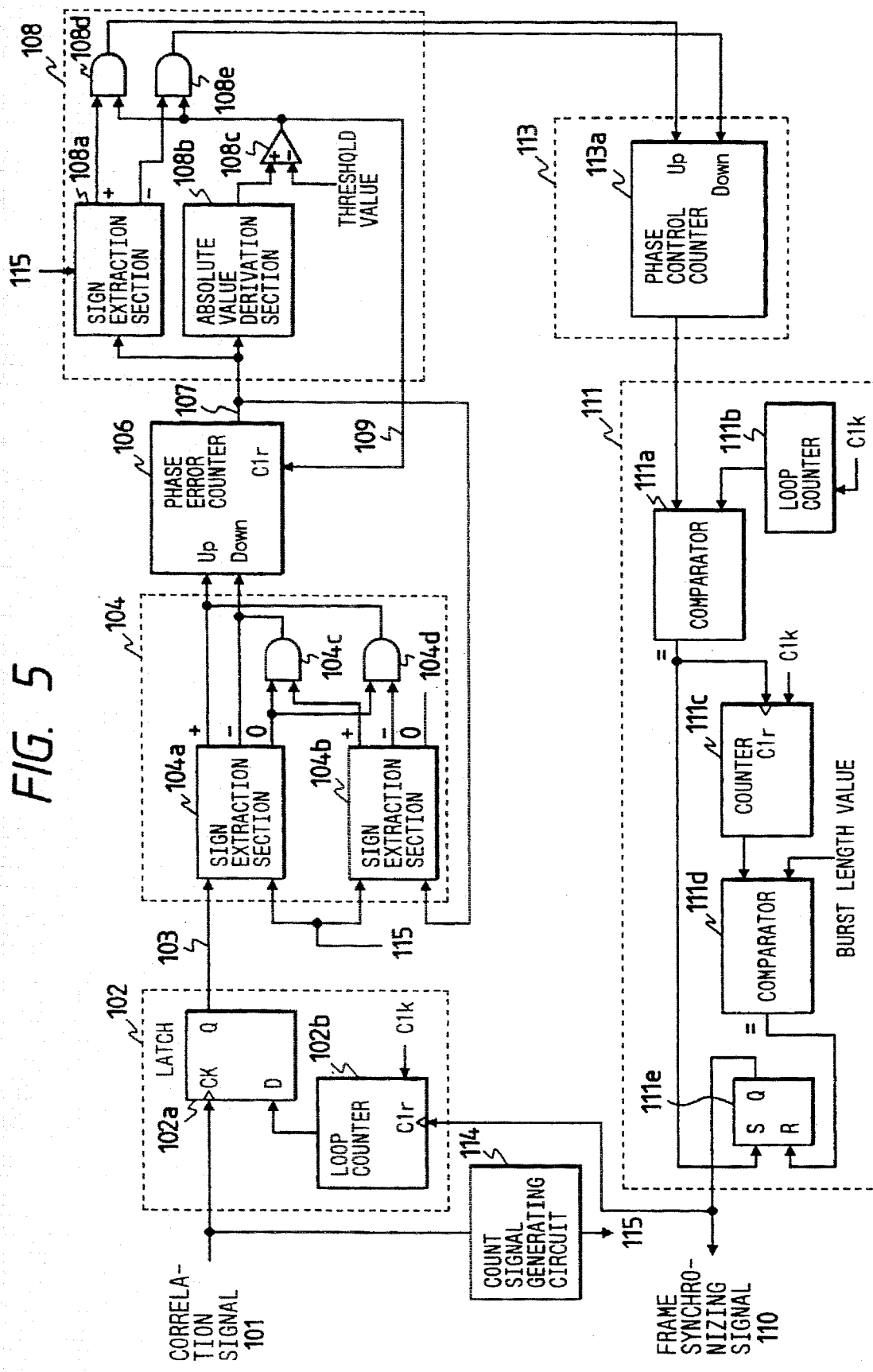
FIG. 5 is a detailed block system diagram of the embodiment of FIG. 4.

The operation of this embodiment can be understood more clearly from the detailed block diagram of FIG. 5, which shows internal details of the various system blocks of FIG. 4. In FIG. 5, signal lines which transfer binary signals are shown as single lines, whereas signal lines which transfer multi-digit values are shown as double lines. The frame synchronizing signal 110 will be assumed to consist of periodic H-level pulses referred to in the following as frame synchronizing pulses.

The phase comparator section 102 consists of a counter 102b, and a latch (i.e. data register) 102a which sequentially holds successive count values of the counter 102b. In FIG.

5 the designation Clk indicates the aforementioned operating clock signal, which is supplied to be counted by the counter 102b. The counter 102b functions as a loop counter, i.e. periodically returns to a count of zero after reaching a maximum count value (if not reset before reaching that value), with a period that is equal to the frame period. The frame synchronizing signal 110 is applied to the "clear" input of the loop counter 102b, such that the count value is reset to zero at the leading edge of each frame synchronizing pulse. The correlation signal 101 is applied to the clock input CK of the latch 102, so that the current count state of loop counter 102b is set into the latch 102 at respective phase comparison time points defined by the correlation signal 101. The count value in the latch 102a is outputted as the data signal 103. It can be understood that the minimum phase difference which can be judged between the correlation signal 101 and the frame synchronizing signal 110 corresponds to the aforementioned operating clock period. Any phase difference which is smaller than that amount (whereby the data output value from the latch 102 is zero) is thus effectively zero.

The counter control section 104 is made up of two sign extraction circuits 104a, 104b, and AND gates 104c, 104d, interconnected as shown. Each of these sign extraction circuits 104a, 104b has three output signal lines designated as the +, − and 0 lines, and selectively sets one of these to the H logic level in accordance with whether the sign of the input data supplied thereto is positive, negative, or the value of the data is zero, respectively. The +, − and 0 outputs of the sign extraction circuit 104a and the + and − outputs of the sign extraction circuit 104b (each of which can be assumed to be produced from a high source impedance) are combined, using the AND gates 104c, 104d as shown, to determine respective signals which are applied to UP and DOWN count control inputs of the phase error counter 106, which is an UP/DOWN (i.e. reversible) counter. The count value held in the latch 102a is supplied to the sign extraction circuit 104a while the count value of the phase error counter 106 is supplied to the sign extraction circuit 104b. In each case, the sign (or zero) condition of the supplied value is judged as follows by the sign extraction section 104a or 104b. If the value is zero, then the 0 output of that sign extraction circuit goes to the "1" level, with the + and − outputs remaining at the L level. If the count value is in the range 1 to ½ of the maximum count value, then the sign is taken to be positive, so that only the + output of the sign extraction circuit goes the H level. If the count value is any other value, then the sign is taken to be negative, and only the − output of the sign extraction circuit goes to the H level level.

A count signal generating circuit 114 receives the correlation signal 101, and generates count signals 115 which go to the active level shortly after each phase comparison operation executed by the section 102. These count signals 115 are applied to control the the sign extraction circuits 104a, 104b such that each circuit generates an H level pulse from its +, − or 0 output terminal, only immediately after a phase comparison operation has occurred, (i.e. when a phase comparison time point has been defined by a level transition of the correlation signal 101).

Thus considering the phase error counter 106, if during a frame interval the Up input of the phase error counter 106 goes to the H level, then the count value 107 is incremented by 1, while if the Down input goes to the H level at that time, the count value 107 is decremented by 1. If no no phase comparison operation occurs in that frame interval however, then the count value 107 remains unchanged. The phase control counter 113a, described hereinafter, is similarly controlled.

If the cumulative phase error value, i.e. the output count value from the phase error counter 106, is zero, then L level outputs will be applied from the sign extraction circuit 104b to each of the AND gates 104c, 104d, so that in this state, no change will occur in the count in the phase error counter 106 so long as the "zero phase error" condition is detected by the sign extraction circuit 104a in each frame interval. If the cumulative phase error value is non-zero and positive, while the amount of phase error detected by the phase comparator section 102 is judged by the sign extraction circuit 104a to be zero (so that only the 0 output of the sign extraction circuit 104a goes to the H level in each frame interval) then the + output of the sign extraction circuit 104b (and hence the output of AND gate 104c) goes to the H level level once during each frame period in which that condition occurs, thereby successively decrementing the cumulative phase error in these frame periods. If the cumulative phase error value is non-zero and negative, while the amount of phase error detected by the phase comparator section 102 is judged by the sign extraction circuit 104a to be zero, then the − output of the sign extraction circuit 104b goes to the H level level once during each frame period in which that condition occurs, thereby successively incrementing the cumulative phase error in these frame periods. Thus, during a condition in which the phase error between the correlation signal 101 and the frame synchronizing signal 110 is found to be effectively zero (i.e. less than one period of the operating clock signal), if the count value held in the phase error counter 106 is other than zero, the absolute value of the cumulative phase error is successively decremented until it reaches zero. Thereafter, no change will occur in the cumulative phase error value, i.e. in the count value 107, so long as the phase error detected by the phase comparator section 102 is judged to be effectively zero.

The error judgement section 108 is made up of a sign extraction section 108a, an absolute value derivation section 108b, a comparator 108c, and AND gates 108d, 108e, interconnected as shown. The count value held in the phase error counter 106 is supplied to the sign extraction section 108a and absolute value derivation section 108b. The sign extraction section 108a has two outputs, designated by + and − respectively, with the + output going to the H level in a condition in which the sign of the cumulative phase error is positive and the − output going to the H level if the sign of the cumulative phase error is negative (with the polarity of the cumulative phase error, as indicated by the count value 107 from the phase error counter 106, being judged by the sign extraction circuit 108a as described above for the sign extraction circuits 104a, 104b). The absolute value of the cumulative phase error is supplied from the absolute value derivation section 108b to one input of the comparator 108c, to be compared with a predetermined threshold value. The output of the comparator 108c is coupled to the "clear" input of the phase error counter 106. If the threshold value is exceeded, so that the output of the comparator 108c goes to the H level, then the count value 107 of the phase error counter 106 is reset to zero, while at the same time, an L to H level transition occurs at the output of the AND gate 108d, if the sign of the phase error is positive, or from the output of the AND gate 108e, if the sign is negative. The outputs of the AND gates 108d, 108e are coupled to the Up and Down count input terminals of the UP/DOWN counter 113a which constitutes the phase control section 113, and will be referred to as the phase control counter 113a. Thus, each time the absolute value of the cumulative phase error count in the phase error counter 106 exceeds the threshold value of the comparator 108c, a logic level transition thereafter is produced at the output of one of the AND gates 108d, 108e (depending on the polarity of the cumulative phase error) whereby the count in the phase control counter 113a is incremented by one if the error sign is positive and is decremented by one if the sign is negative.

Figure 1:
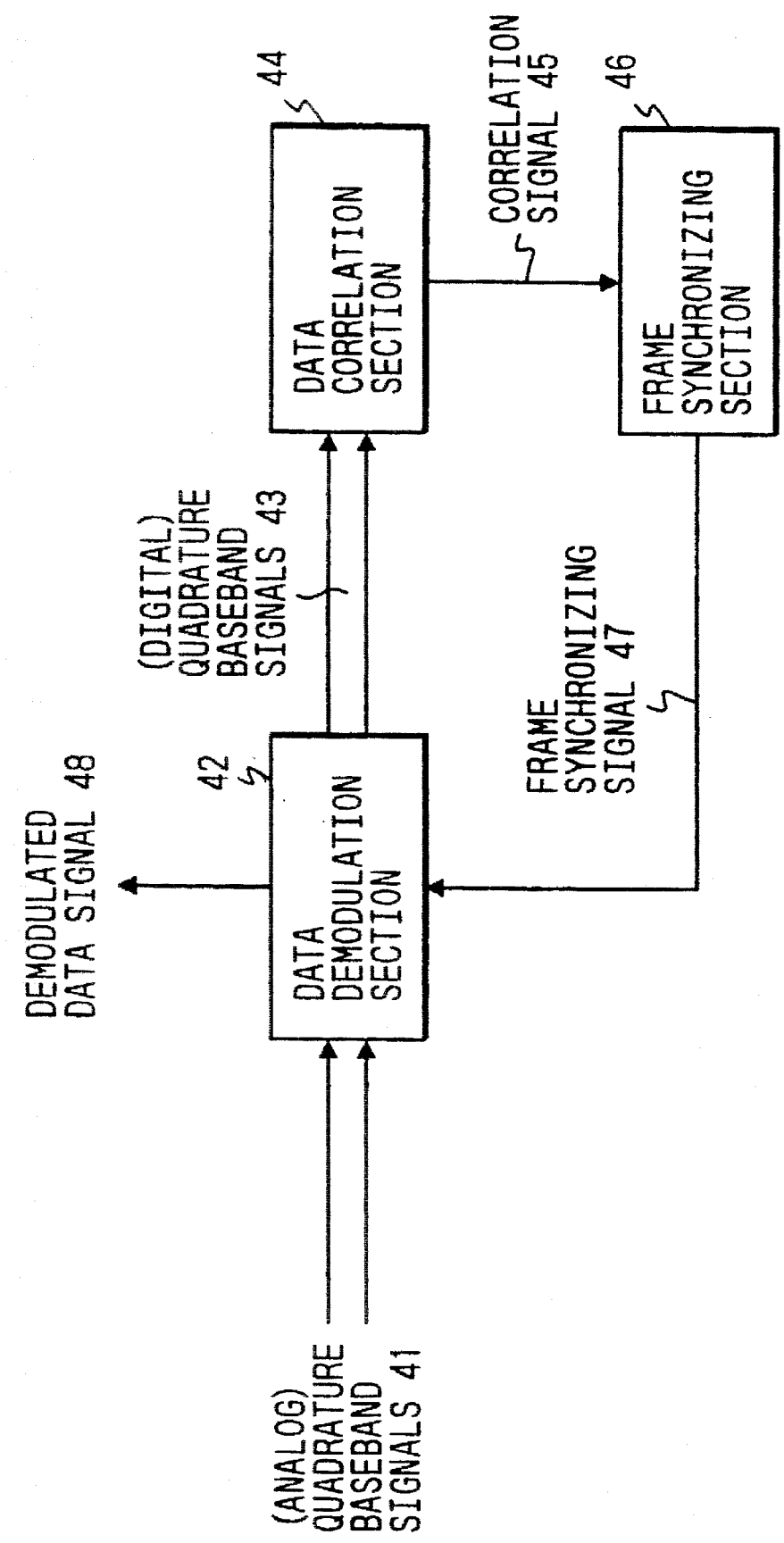
FIG. 1 is a general block system diagram illustrating data correlation and synchronizing signal generating sections of a TDMA digital communication radio receiver apparatus, wherein a correlation signal is derived based upon quadrature baseband signals.
Figure 2:
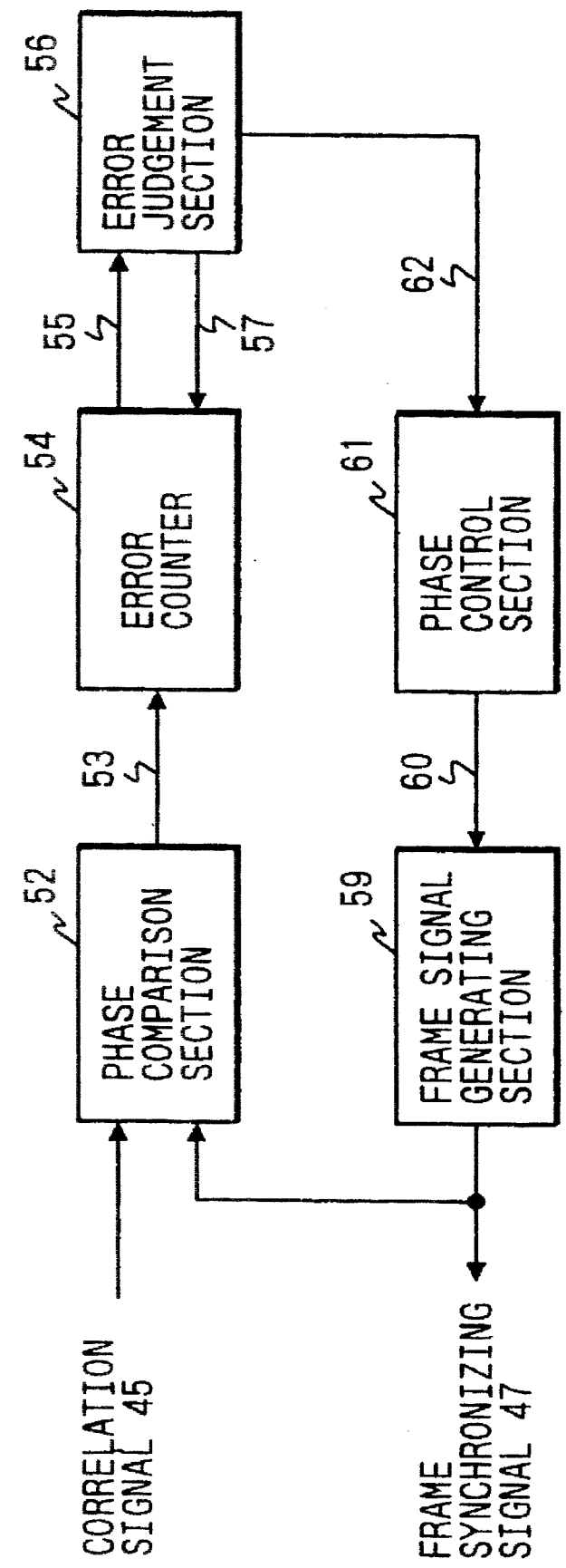
FIG. 2 is a general block system diagram of an example of a prior art circuit for generating a frame synchronizing signal that is phase-locked with a correlation signal.

The frame signal generating section 111 consists of a comparator 111a, a loop counter 111b which continuously counts the operating clock Clk, a counter 111c which also counts the operating clock Clk, a comparator 111d, and an R-S flip-flop 111e which produces the frame synchronizing signal 110, as periodic fixed-length frame pulses. The current count values of the phase control counter 113a and the loop counter 111b are compared by the comparator 111a, with each time point at which these coincide defining the starting point of a frame interval, i.e. the leading edge of a frame synchronizing signal pulse which is produced by the R-S FF 111e. The repetition period of counting by the loop counter 111b is equal to the frame period. The comparator 111d compares the count value of the counter 111c with a fixed value, referred to as the burst length value, and each time point at which coincidence is detected defines the trailing edge of a frame synchronizing signal pulse. Each time that coincidence between the count values in the phase control counter 113a and the loop counter loop counter 111b occurs, an output signal from the comparator 111a resets the counter 111c, and at the same time sets the R-S FF 111e. Each time the count value in the counter 111c coincides with the burst length value, an output signal from the comparator 111d resets the R-S FF 111e. Thus the burst length value determines the frame synchronizing signal pulse width. It can be understood from the above that the circuit of FIG. 5 constitutes a digital PLL, whereby the frame synchronizing signal 110 is held phase-locked to the correlation signal 101. The essential novelty and advantages provided by the present invention lie in the counter control section 104c, which functions, as described above, to control the operation of the phase error counter 106 such that in a condition in which the phase error between the frame synchronizing signal 110 and correlation signal 101 is effectively zero (i.e. less than one period of the operating clock signal of the phase comparator section 102) the cumulative phase error value held in the phase error counter 106 is successively brought to zero, and thereafter is left unchanged so long as the phase error between the frame synchronizing signal 110 and the correlation signal 101 remains effectively zero. Hence, a high degree of stability is achieved for the phase of the frame synchronizing signal 110. That advantage is basically achieved due to the fact that with the above embodiment, three possible conditions of phase relationship between the correlation signal and the frame synchronizing signal are utilized, i.e. phase advance, phase retardation, and effectively zero phase difference. With a prior art system such as that of FIG. 2 described hereinabove, such a degree of phase stability cannot be achieved, since the condition of zero phase difference cannot be recognized.

Figure 6:
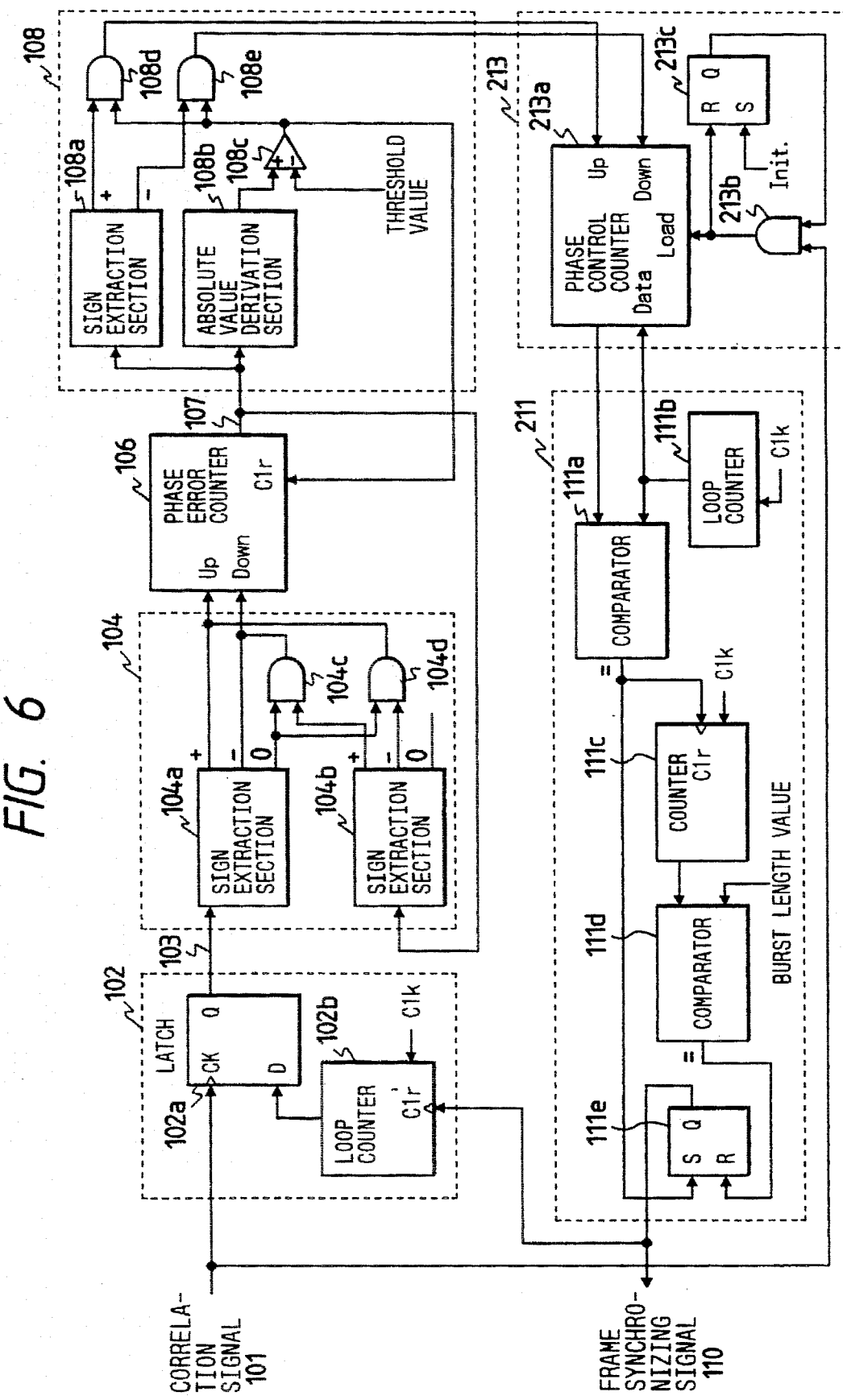
FIG. 6 is a detailed block system diagram of a second embodiment of a frame synchronizing signal generating apparatus according to the present invention.

A second embodiment of a frame synchronizing apparatus according to the present invention will be described, referring to the detailed block circuit diagram of FIG. 6. In FIG. 6 the circuit blocks designated by the numerals 102, 104, 106, 108, and 111 respectively correspond to the identically numbered blocks of the first embodiment, shown in FIG. 5 and described hereinabove, and further description will be omitted. To simplify the drawing, the count signal generating circuit 115 is not shown, but controls the sign extraction circuits as described for the embodiment of FIG. 5. This embodiment differs from the first embodiment in that a phase control section 213 is provided in place of the phase control section 113 of the first embodiment, with the phase control section 213 being coupled to receive the correlation signal 101 as well as the the output signals from the AND-gates 108d, 108e of the error judgement section 108. In addition, the frame signal generating section 211, which otherwise corresponds to the frame signal generating section 111 of the first embodiment, supplies the count value of the loop counter 111b to a Data input of the phase control counter 213a in the phase control section 213. That count value is thereby loaded into the phase control counter 213a each time that a control signal applied to a Load input of the phase control counter 213a goes from the L level to H level. The phase control section 213 further includes a R-S FF 213c and an AND gate 213b, with the Q output of the R-S FF 213c being applied to one input of the AND gate 213b and the correlation signal 101 being applied to the other input of that AND gate. The output of the AND gate 213b is connected to the R input of the R-S FF 213 and to the Load input of the phase control counter 213a, while a signal designated as Init is applied to the S input of the phase control section 213. The Up and Down inputs of the phase control counter 213a are coupled to the error judgement section 108, and the count value in the phase control counter 213a is supplied to the comparator 111a, in the same manner as described above for the phase control section 113 of the first embodiment.

Only the points of difference between this embodiment and the first embodiment will be described. The Init signal is a signal which goes from the L level to the H level whenever initialization of phase synchronization becomes necessary, i.e. when the phase of the frame synchronizing signal 110 is undefined, so that it becomes necessary to execute pull-in of the phase of the frame synchronizing signal 110 to that of the correlation signal 101. When such a transition of the Init signal occurs, so that the Q output of the phase control section 213 is set at the H level, the next pulse of the correlation signal 101 to occur will cause an output signal from the AND gate 213b to reset the R-S FF 213 and will load the current count value of the loop counter 111b into the phase control counter 213a. Thus, an output signal from the comparator 111a will immediately set the R-S FF 111e and clear the counter 111c to zero, so that the leading edge of a frame pulse of the frame synchronizing signal 110 will occur, which will be closely matched in phase with the correlation signal 101. Hence, very rapid phase pull-in between the frame synchronizing signal 110 and correlation signal 101 can be achieved. Otherwise, the second embodiment is similar to of the first embodiment.

Figure 7:
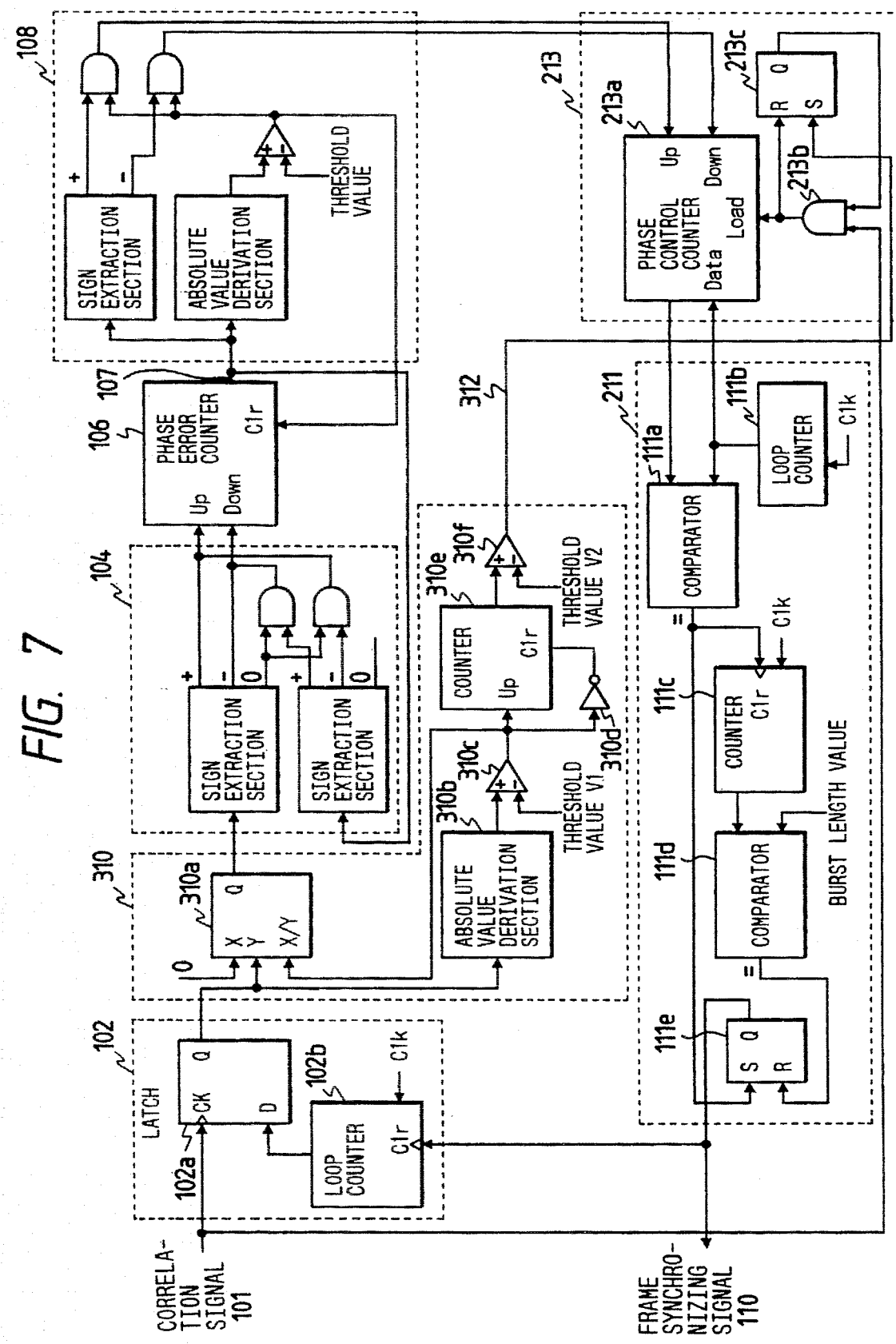
FIG. 7 is a detailed block system diagram of a third embodiment of a frame synchronizing signal generating apparatus according to the present invention.

A third embodiment of the invention will be described, referring to the block system diagram of FIG. 7. This embodiment differs from the second embodiment described above in that, instead of receiving an externally supplied signal (Init) when a condition of phase synchronizing initialization occurs, the frame synchronizing apparatus itself detects when phase lock between the correlation signal 101 and frame synchronizing signal 110 has been lost, and generates a signal (referred to in the following as the pull-in control signal 312) which is utilized in a similar manner to the aforementioned Init signal to implement rapid phase pull-in. The pull-in control signal 312 is generated by a phase error judgement section 310, which is connected between the phase comparison section 102 and the phase error counter 106 as shown. In all other respects, the configuration and operation of this embodiment is identical to that of the third embodiment.

The phase error judgement section 310 consists of a data selector 310a which selects either a 0 value or the phase error value (i.e. the data currently held in the latch 102a) to be supplied to the counter control section 104, an absolute value derivation section 301b which derives the absolute value of the phase error, a comparator 310c which compares that absolute value with a first predetermined threshold value (which will be designated as V1, to distinguish this from the threshold value which is used in the error judgement section 108) and produces an H level output when that absolute value exceeds the first threshold value V1, a counter 310e which is controlled by the output of the comparator 310c to execute counting up when the absolute value of the phase error is above the first threshold value V1, and which is held reset at a count of zero by the inverted output from the comparator 310c when the absolute value of the phase error is below the first threshold value V1. The phase error judgement section 310 further includes a comparator 310f which compares the count value of the counter 310e with a second threshold value V2, and produces the pull-in control signal 312, which goes to the H level level when the count value of the counter 310e exceeds the second threshold value V2, and otherwise remains at the L level.

The output of the comparator 310c is also applied to a selection control input of the selector 310a, such that the phase error value from the phase comparison section 102 is supplied to the phase error judgement section 310 only when the absolute value of the phase error is below the aforementioned first threshold value V1.

The counter 310e can be controlled for example such that the count therein is incremented by one in each frame period, so long as the absolute value of the phase error exceeds the first threshold value V1. It can thus be understood that with this embodiment, the phase relationship between the correlation signal 101 and frame synchronizing signal 110 is continuously monitored, and when the phase error between these is found to exceed a predetermined amount for a predetermined number of successive frame intervals, the phase pull-in mode is entered, whereby the frame synchronizing signal 110 is immediately brought into substantial phase coincidence with the correlation signal 101, at the next pulse of the correlation signal 101 to occur after the pull-in control signal 312 goes to the H level. Thus, the phase pull-in mode will only be entered if the amount of phase error becomes sufficiently large, and persists for a sufficient length of time.

It should be noted that it would of course also be possible to modify a prior art type of digital PLL of a frame synchronizing apparatus in a similar manner to that in which the first embodiment of the present invention was modified to provide the second embodiment, to provide the advantage of rapid phase pull-in in response to an externally supplied phase initialization indication signal. It would be equally possible to modify a prior art type of digital PLL of a frame synchronizing apparatus in a similar manner to that in which the first embodiment of the present invention was modified to provide the third embodiment, to provide the advantage of continuously monitoring the phase relationship between the correlation signal 101 and frame synchronizing signal 110, to achieve rapid phase pull-in whenever phase lock is lost.

Figure 8:
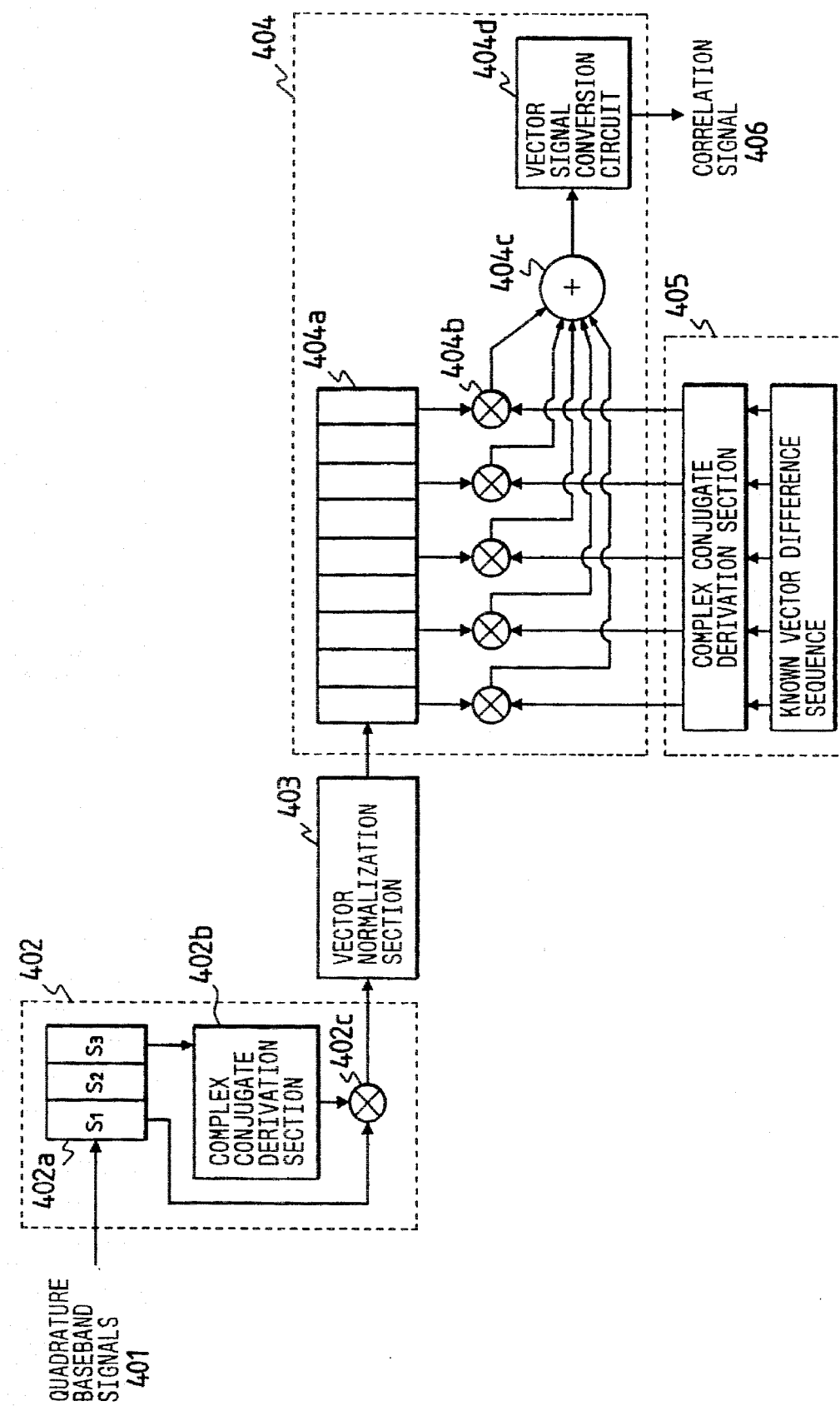
FIG. 8 is a block system diagram of a first embodiment of a correlation signal generating apparatus according to the present invention.

A fourth embodiment of the invention will be described referring to FIG. 8. This is a correlation signal generating circuit for use in a radio receiving apparatus of a digital communication system, for generating a correlation signal for use in deriving a frame synchronizing signal, i.e. corresponding to the correlation signal 101 of the above embodiments. In FIG. 8, 402 denotes a vector difference generating section which receives a pair of digital quadrature baseband signals 401 (consisting of successive vector values derived by periodic sampling of baseband signals as described hereinabove) and includes a shift register 402a (which actually is formed of a parallel pair of shift registers, for receiving the respective component values of the vector values) into which the vector values are shifted in synchronism with the aforementioned operating clock signal, i.e. in successive sample periods. To simplify the drawing, it is assumed that the A/D conversion sampling rate applied to the quadrature baseband signals is only twice the symbol rate, so that there two vector values are obtained per symbol period. The shift register 402a serves to provide, in parallel, the current received vector value and a received vector value which occurred one symbol period previously.

It should be understood that all of the signal lines shown in FIG. 8, other than that of correlation signal 406, convey vector data, i.e. parallel multi-digit values.

To avoid confusion, the vector values that are supplied as the digital quadrature baseband signals 401 will be referred to as the received vector values, to distinguish these from a sequence of known vector values, representing the aforementioned known symbol sequence.

Figure 9:
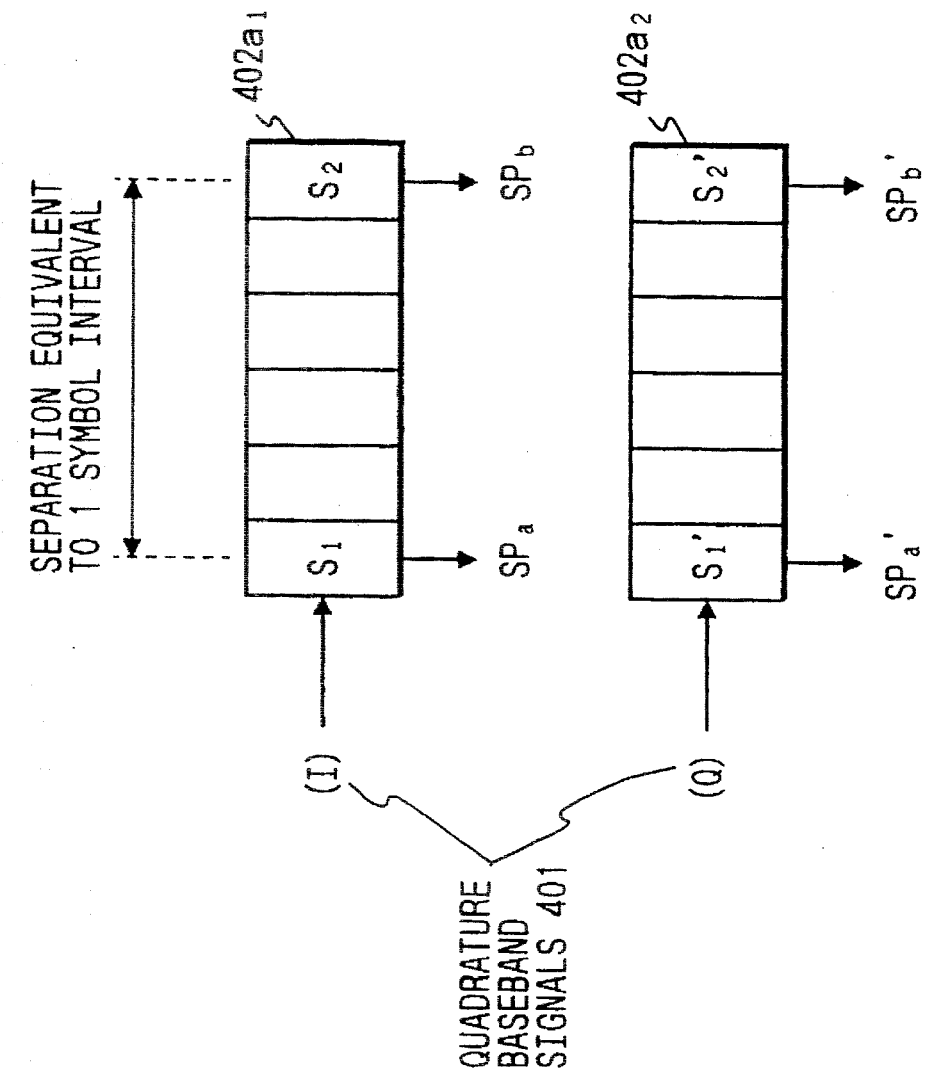
FIG. 9 illustrates the configuration of a shift register in the embodiment of FIG. 8.

FIG. 9 illustrates an actual configuration for the shift register 402a, formed of a parallel pair of shift registers $402a_1$, $402a_2$, assuming that the sampling rate applied to the baseband signals is five times the symbol rate, so that there are five vector values per symbol period. The received vector values are shifted into the shift registers $402a_1$, $402a_2$ in synchronism with the operating clock, so that during each operating clock period the current received vector value (expressed by the sample pair designated SPa,SPa') and a received vector value which precedes the current received vector value by one symbol period (expressed by the sample pair SPb, SPb') are outputted concurrently.

In the vector difference generating section 402, during each operating clock period, the vector difference value between the two received vector values expressed by the sample pairs SPa, SPa' and SPb, SPb' is derived, i.e. two vector values which differ in time by one symbol interval. This is achieved by supplying the current received vector value to one input of a vector multiplier 402c, while the complex conjugate of the received vector value of one symbol interval previously is derived by a complex conjugate derivation section 402b and supplied to the other input of the vector multiplier 402c. The vector difference between these two received vector values is thereby produced from the vector multiplier 402c. The received vector value difference values that are thus successively obtained are supplied to a vector normalization section 403.

The vector normalization section 403 normalizes each received vector value difference value, by converting the vector length to a fixed value. The normalized received vector difference values thus obtained are successively shifted into a shift register 404a within a vector correlation section 404, in sequential periods of the operating clock signal. The vector correlation section 404 further includes a set of multipliers 404b, and a vector adder 404c.

405 denotes a known vector difference generating section, which generates a sequence of normalized known vector difference values based upon the aforementioned fixed symbol sequence. Each vector difference value produced in the known vector difference generating section 405 is taken between one symbol of the known symbol sequence and the succeeding symbol of the sequence, and is normalized as described above. The respective complex conjugates of the normalized known vector difference value sequence are derived in the known vector difference generating section 405, and outputted to the vector correlation section 404 as shown.

For ease of understanding, the known vector difference generating section 405 is shown in the drawing as consisting of a register which holds and outputs the normalized known vector difference value sequence, and a complex conjugate derivation section. However in practice the known vector difference generating section 405 preferably consists of data registers or memory in which are held pre-computed complex conjugate values of the normalized known vector difference sequence.

Each adjacent pair of values in the sequence of output vector difference values taken out in parallel from the shift register 404a to be supplied to the vector multipliers 404b, is mutually separated by one symbol period, and the number of these values is identical to the number of symbols in the known symbol sequence.

In each sample interval, the complex conjugates from the known vector difference generating section 405 and the corresponding vector differences that are outputted from the shift register 404a are multiplied together by the vector multipliers 404b, to obtain respective vector products. Each of these expresses the vector difference between a received vector difference value held in the shift register 404a and a corresponding one of the known vector difference values derived from the known symbol sequence. These vector products are summed by the vector adder 404c. The length (absolute value) of the resultant sum vector expresses the degree of correlation between the received vector difference value sequence and the known vector difference value sequence, in the current sample interval.

A vector signal conversion circuit 404d converts the successive vector sum values to corresponding scalar values, to obtain the correlation signal 406, which varies in level in accordance with the degree of correlation between the quadrature baseband signals and the known symbol sequence.

Figure 3:
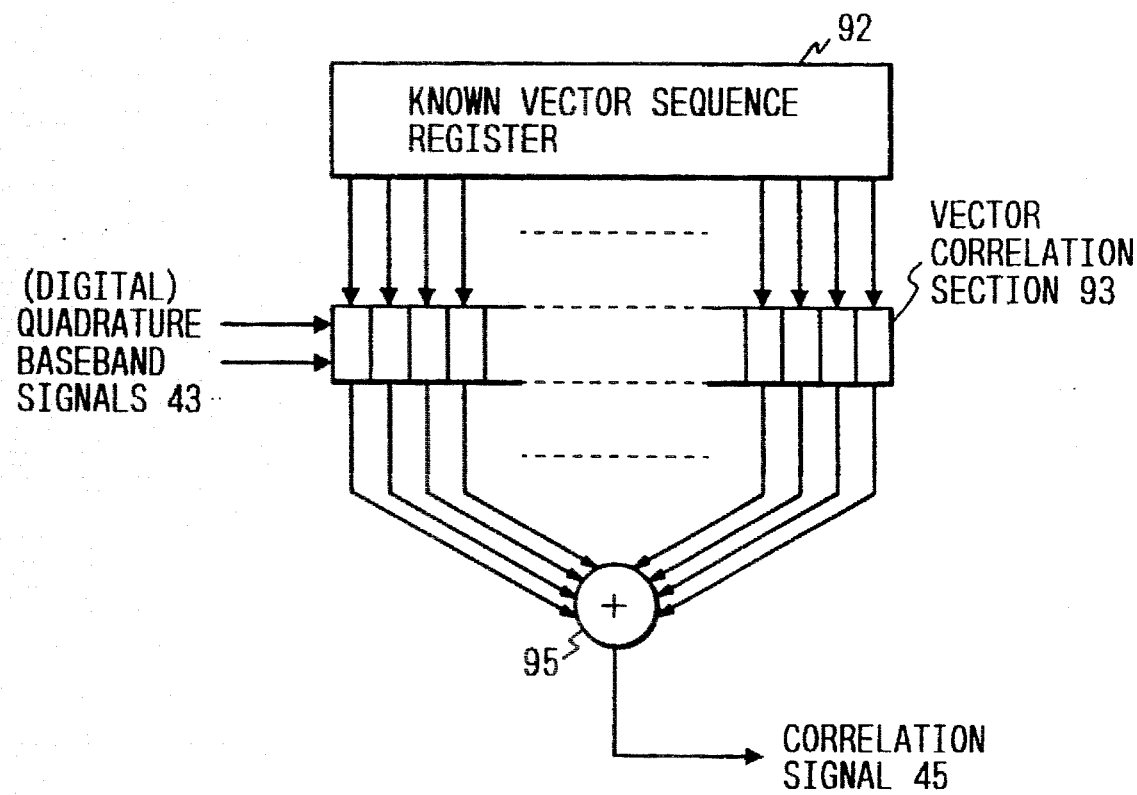
FIG. 3 is a diagram for illustrating a prior art apparatus for deriving a correlation signal from quadrature baseband signals, by detecting correlation with a known symbol sequence.

It has been found that the above embodiment, in which correlation is detected by comparison between successive vector difference values of the received quadrature baseband signals and the known sequence of vector difference values, produces a correlation signal whose change in amplitude (when correlation between the quadrature baseband signals and the known symbol sequence occurs) is larger and more consistent under varying conditions of radio reception, than can be obtained with a prior art apparatus in which direct comparison is executed between sequences of received vector values and the vector values expressing the known symbol sequence, such as that of FIG. 3 above.

Specifically, with the above embodiment, correlation is based upon the vector differences between successive symbols in the received data. These vector differences will be substantially unaffected by any frequency offset of local oscillator frequency of the radio receiving apparatus, which is used to demodulate a received radio signal to obtain the (analog) baseband signals. Such a frequency offset results in phase rotation between successive vector values obtained from the quadrature baseband signals. However with the above embodiment of the invention, the effects of such phase rotation are substantially cancelled, i.e. the frequency offset will not reduce the phase accuracy of the correlation signal. Alternately stated, the embodiment enables a fixed symbol sequence to be utilized that is substantially long, so that a large-magnitude correlation signal can be consistently derived, while maintaining phase accuracy of the correlation signal.

Figure 10:
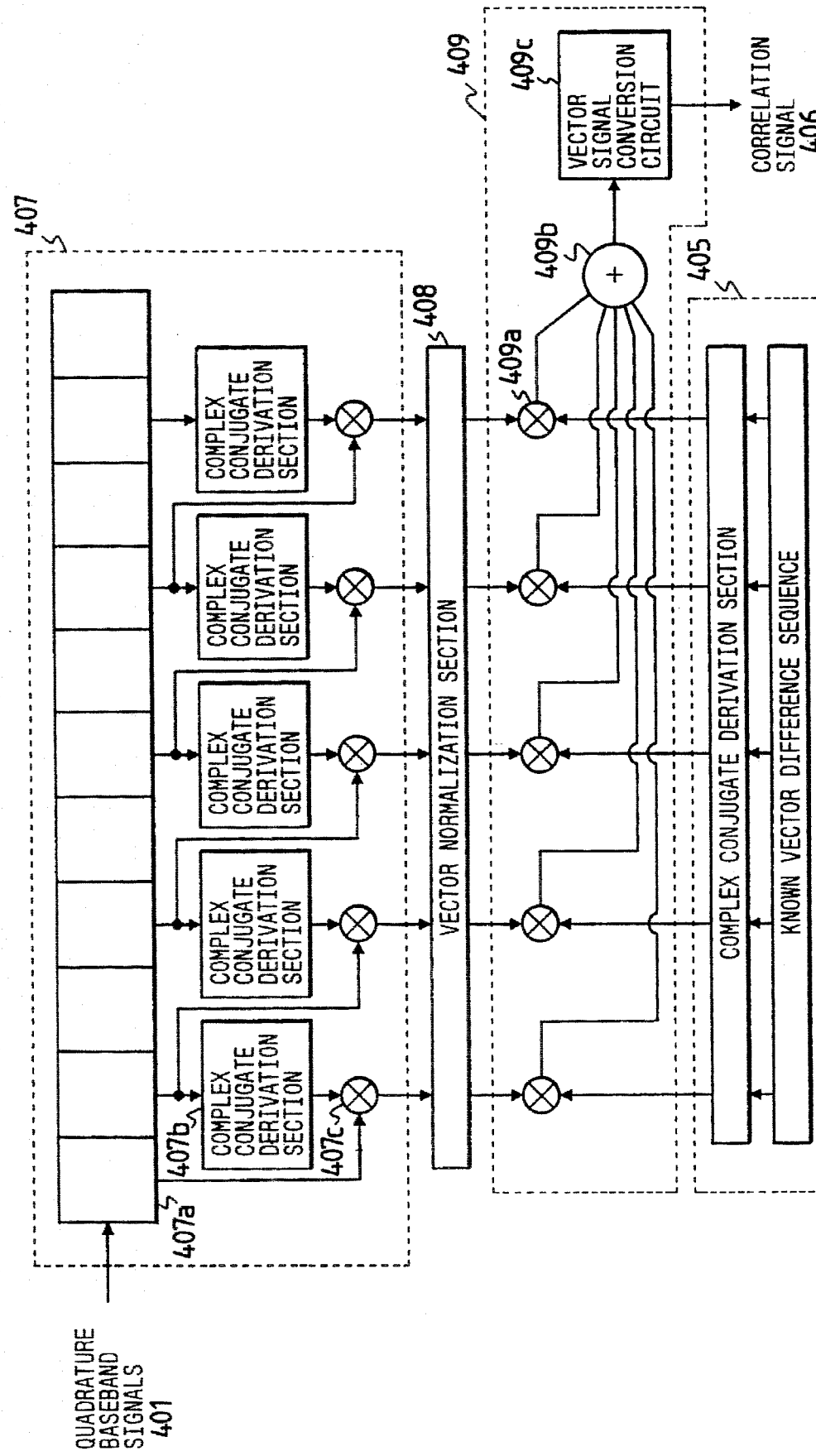
FIG. 10 is a block system diagram of a second embodiment of a correlation signal generating apparatus according to the present invention.

A fifth embodiment of the invention will be described referring to the block system diagram of FIG. 10. The basic operation and the advantages obtained with this embodiment are similar to those of the fourth embodiment described above. In FIG. 10, the digital quadrature baseband signals 401 are supplied to a vector difference generating section 407, which is formed of a shift register 407a, a set of complex conjugate derivation sections 407b, and a set of vector multipliers 407b. The successive vector values constituting the digital quadrature baseband signals 401 are shifted into the shift register 407a in synchronism with the operating clock signal. During each period of the operating clock signal, each value of a sequence of the received vector values held in the shift register 407a, other than the final vector value of that sequence (the sequence values being respectively mutually spaced apart by one symbol interval, and the number of values being identical to the number of symbols of the known symbol sequence) is supplied in parallel to a corresponding one of the complex conjugate derivation sections 407b, to derive the complex conjugate of that received vector value. Each complex conjugate value thus obtained is supplied to a corresponding one of the vector multipliers 407c. In addition, a received vector value of the sequence is also supplied from the shift register 407a to each of the vector multipliers 407c, i.e. a vector value which differs by one symbol period (in the quadrature baseband signal stream) from the vector value of the complex conjugate supplied to that vector multiplier. Each vector product thus produced from the vector multipliers 407c is supplied, as the vector difference between a received vector value and the received vector value which occurs one symbol period later, to a vector normalization section 408, to be converted to a normalized vector difference value.

The respective normalized received vector difference values thereby produced from the vector normalization section 408 are supplied to a vector correlation section 409, which consists of a set of vector multipliers 409a and a vector adder 409b. Each of the normalized received vector differences is applied to one input of a corresponding one of the vector multipliers 409a, while a complex conjugate of a normalized known vector difference (obtained based on the known symbol sequence, from a known vector difference generating section 405, in the same way as described for the preceding embodiment), is applied to the other input of that vector multiplier 409a.

Each of the outputs thereby produced from the vector multipliers 409a is supplied to the vector adder 409b, which produces successive vector sum values, with the sum vector length values expressing respective degrees of correlation between the known symbol sequence and the digital quadrature baseband signals 401. The vector sum values are supplied to a vector signal conversion circuit 409c, to obtain a (scalar) correlation signal 406 whose level varies in accordance with the degree of correlation between the quadrature baseband signals and the known symbol sequence, in the same same way as described for the preceding embodiment.

In the case of use in a TDMA communication system which utilizes QPSK (Quadrature Phase-Shift Keying) modulation, it becomes possible to simplify the vector multiplication operations that are performed in the above embodiments. This simplification is based on the fact that with QPSK modulation, the vectors expressed by the quadrature baseband signals can take only four possible angular positions in the complex plane, i.e. $\pi/4$, $3\pi/4$, $-\pi/4$, or −3π/4. Thus, simplification of the vector multiplication operations can be achieved if the vector difference generating section 405 outputs a set of normalized vectors (i.e. each having a vector length of 1), each of which is derived by rotating through an angle of −π/4 the complex conjugate of the vector difference between two adjacent symbols of the known symbol sequence. If that is done, then it will be clear that for each of these output vector values from the known vector difference generating section 405, the real and imaginary coordinates corresponding to the vector in the complex plane will be either expressed as (1, 0), (0, 1), (−1, 0) or (0, −1). A vector multiplication between two vectors expressed as (a+jb) and (c+jd) respectively is performed as (ac+bc)+ j(ad+bc). Thus, if vector normalization is executed so that each of the quantities a and b can only take the values 0, 1, or −1, it will only be necessary to execute changes in sign to effect the required multiplication operations. It can easily be demonstrated mathematically that such a rotation by −π/4, applied to all of the complex conjugates of the known vector differences, will have no effect upon the phase accuracy of the correlation signal that is obtained by summing the results of such vector multiplications. Thus the invention is especially advantageous when applied to digital radio communications employing QPSK modulation.

Figure 11:
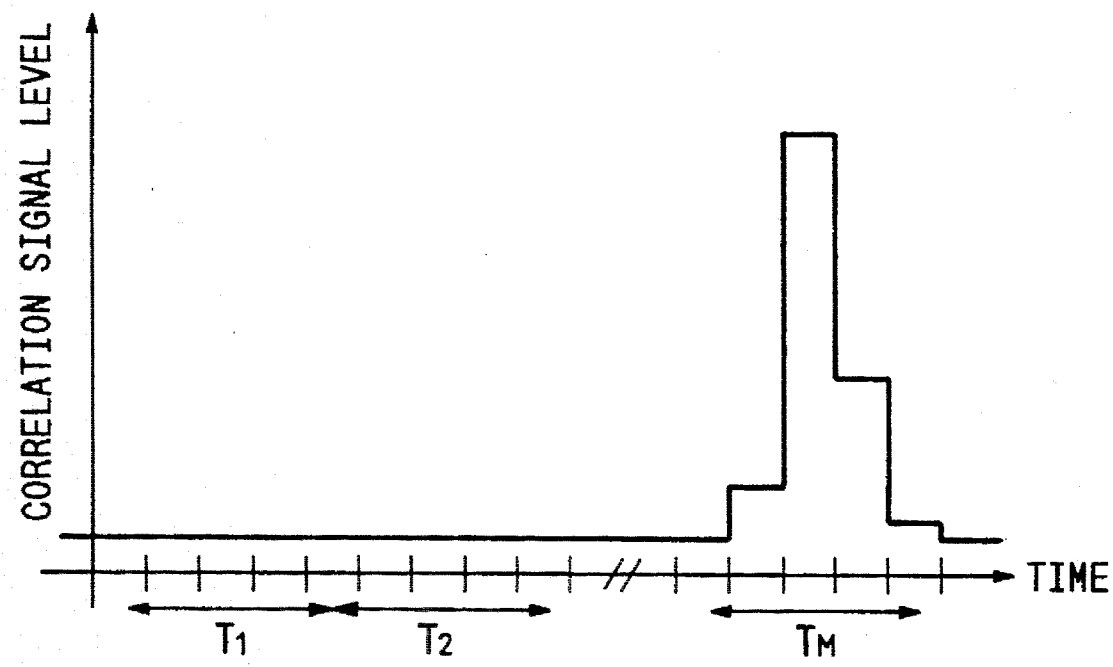
FIG. 11 is a timing diagram illustrating an example of a correlation signal.

FIG. 11 is a diagram to illustrate how the level of the correlation signal 406 might vary during one frame interval, when the known symbol sequence is detected in the received data. It is assumed that each symbol corresponds to five sample periods and also that vector/scalar signal conversion to obtain the correlation signal 406 is implemented such that the level of the correlation signal increases in accordance with increasing correlation. Values of the correlation signal level are plotted along the vertical axis, and time along the horizontal axis. $T_1, T_2, \ldots T_M$ denote respective symbol intervals in the received data frame. Within the last of these symbol intervals, $T_M$, the level of the correlation signal 406 reaches a maximum value in a sample interval. If threshold detection of such a correlation signal is executed using a suitable threshold value, the resultant binary pulses can be utilized as a frame timing reference signal for use in generating a frame synchronizing signal, i.e. can be used as the "correlation signal 101" of the first, second or third embodiments described above. To avoid misunderstanding, such a binary signal will be referred to as a "level-detected correlation signal".

Moreover, the central time point of each of these binary pulses of a level-detected correlation signal will closely approximate to the optimum symbol discrimination time point, i.e. the midway point of each symbol interval of the received data. These central time points are therefore suitable symbol reference time points, for use in demodulating the digital quadrature baseband signals to recover the transmitted data, i.e. for periodically selecting the appropriate samples (vector values) to be used in that demodulation.

Figure 12:
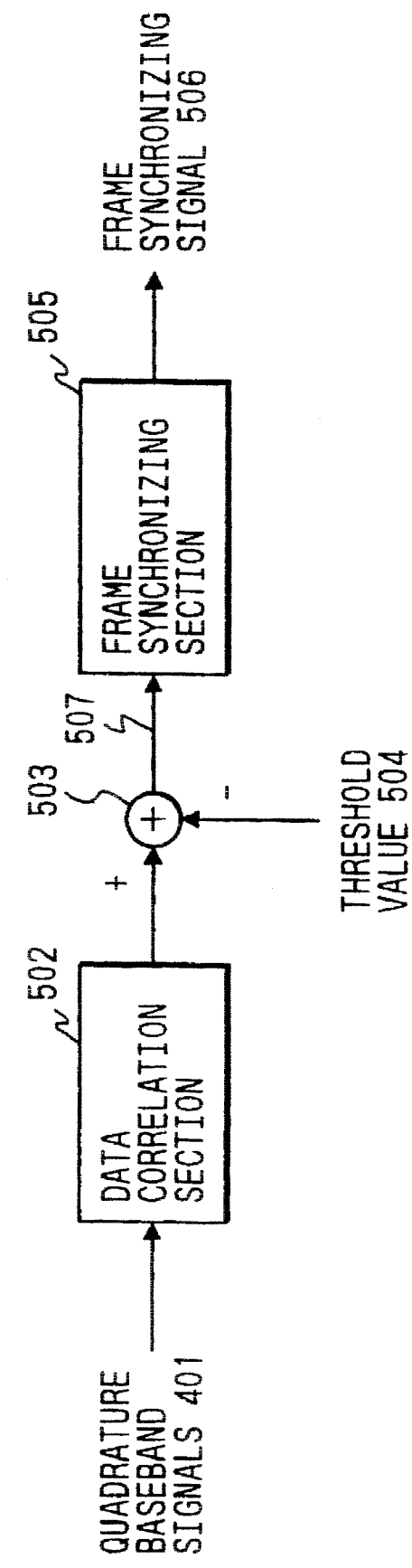
FIG. 12 is a diagram showing an example of a judgement circuit for level-detection of a correlation signal.

FIG. 12 shows an example of deriving a level-detected correlation signal in generating a frame synchronizing signal. In FIG. 12, the correlation signal is derived by a data correlation section 502 which can be configured as shown in FIG. 8 or FIG. 10 above, and applied to one input of a subtractor 503, while a threshold value 504 is applied to the other input of the subtractor. It is assumed that the level of the correlation signal increases (positively) in accordance with increases in correlation, so that a level-detected correlation signal 507 is obtained in which H level pulses occur in synchronism with occurrences of the known symbol sequence in the received data. That correlation 507 signal is supplied to a frame synchronizing section 505. The frame synchronizing section 505 can be configured as shown for the first, second or third embodiments of the invention described above, to generate a frame synchronizing signal.

Figure 13:
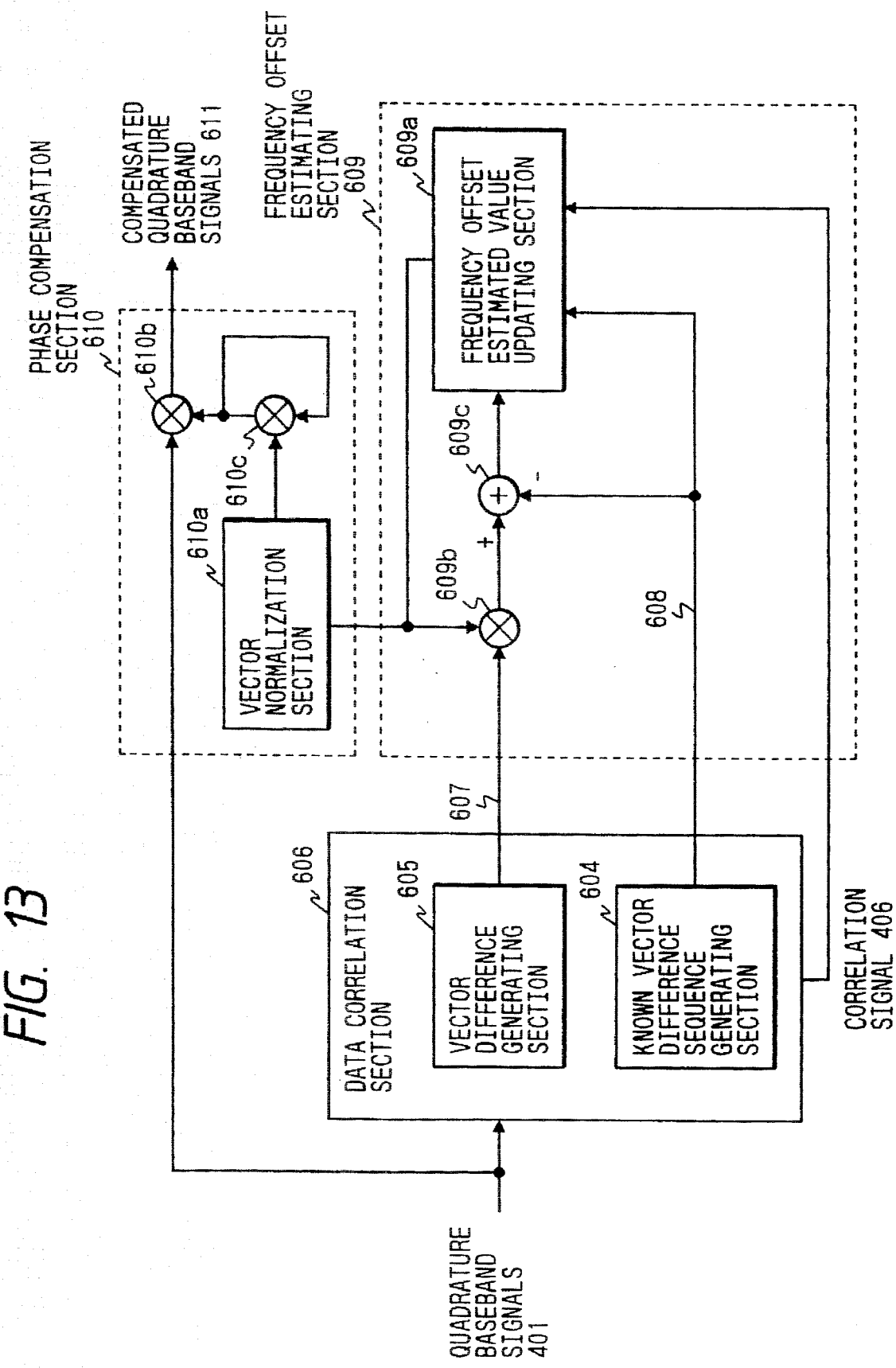
FIG. 13 is a general block system diagram of a first embodiment of a frequency offset compensation apparatus according to the present invention, for executing correction of phase rotation in quadrature baseband signals resulting from a frequency offset.

A sixth embodiment of the invention will be described referring to FIG. 13. This embodiment is a frequency offset compensation apparatus, which executes phase compensation of the digital quadrature baseband signals to correct for the aforementioned phase rotation which results from to a frequency offset of the local oscillator frequency of the radio receiving apparatus. The embodiment consists of a data correlation section 606, a frequency offset estimation section 609 and a phase compensation section 610. The data correlation section 606 can be essentially similar to the fourth embodiment of the invention described above referring to FIG. 8, and includes a vector difference generating section 605 and a known vector difference sequence generating section 604. The vector difference generating section 605 can be configured for example as shown for the vector difference generating section 402 in the embodiment of FIG. 8 described hereinabove, i.e. receiving (digital) quadrature baseband signals 401 and generating successive vector difference values 607 between adjacent pairs of vector values that are separated by one symbol interval. The data correlation section 606 also includes sections (not shown, for example as in the embodiment of FIG. 8) for deriving a correlation signal 406, while in addition the known vector difference sequence generating section 604 is configured to cyclically output successive vector difference values of the known vector difference sequence.

The frequency offset estimation section 609 consists of a frequency offset estimated value updating section 609a, a vector multiplier 609b and vector adder 609c. The frequency offset estimated value updating section 609a functions to periodically update an estimated frequency offset value, which is expressed as a complex number (i.e. representing an amount of phase rotation of the symbols conveyed by the digital quadrature baseband signals 401, that would result from the estimated frequency offset). The correlation signal 406 is supplied as a control input to the frequency offset estimated value updating section 609a, while successive vector products of the estimated frequency offset produced from the frequency offset estimated value updating section 609a and the sequentially obtained vector difference values 607 from the data correlation section 606 are derived by the vector multiplier 609b. For each such vector product, the known vector difference value which is being currently produced from the data correlation section 606 is subtracted from that vector product, in the vector subtractor 609c, to obtain a corresponding estimated phase error value. That estimated phase error value is supplied to the frequency offset estimated value updating section 609a, together with the corresponding known vector difference value. The frequency offset estimated value updating section 609a includes a threshold detection circuit for detecting when the level of the correlation signal 406 has exceeded a predetermined threshold value. Each time that this occurs, the frequency offset estimated value updating section 609a updates the value of the estimated frequency offset. Such updating occurs only when the correlation signal 406 exceeds the threshold value, ensuring that each updated estimated value will be calculated when an occurrence of the known symbol sequence is detected in the quadrature baseband signals 401.

The frequency offset estimated values which are derived by the frequency offset estimated value updating section 609a are obtained using digital signal processing using suitable software of known type, e.g. utilizing an RLS algorith, or LMS algorithm, so that detailed description will be omitted.

Each estimated frequency offset value thus obtained is supplied to the phase compensation section 610, which consists of vector multipliers 601b, 610c and a vector normalization section 610. The vector normalization section 610 normalizes the estimated frequency offset value by converting that value to have a fixed vector length of 1, and the resultant normalized estimated frequency offset value is multiplied by a current phase offset compensation vector value, in the multiplier 610c, to obtain a new phase offset compensation vector value as the vector product. The vector product of that phase offset compensation vector and each successive vector value of the digital baseband signals 401 is then obtained, to achieve phase compensation. Compensated digital quadrature baseband signals 611 are thereby obtained, phase-compensated for the frequency offset.

As described hereinafter, a symbol reference timing signal can be generated which is accurately synchronized with the correlation signal 406, and whose periods correspond to symbol intervals of the baseband signals. The phase compensation section 610 is controlled by such a symbol reference timing signal signal, to execute a phase compensation operation once in each period of that symbol timing reference signal.

Figure 14:
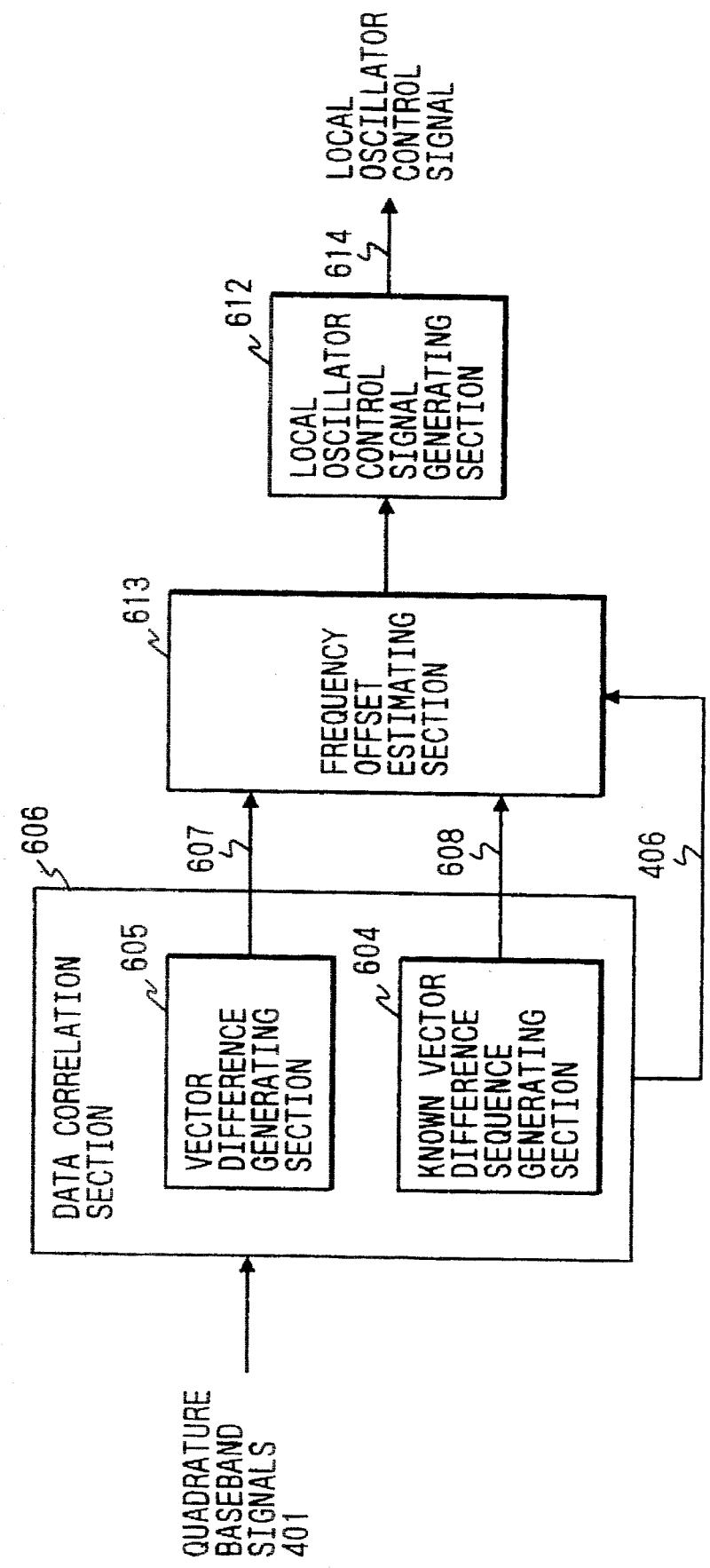
FIG. 14 is a general block system diagram of a second embodiment of a frequency offset compensation apparatus according to the present invention, whereby a frequency offset is compensated by operating on a local oscillator control signal.

A seventh embodiment of the invention will be described referring to FIG. 14. The function and configuration of this embodiment are basically similar to those of the sixth embodiment of FIG. 13 described above, so that only the points of difference from the seventh embodiment will be described. In FIG. 14, the data correlation section 606 and the frequency offset estimation section 613 respectively corresponding to the data correlation section 606 and the frequency offset estimation section 609 in FIG. 13 above. As for each of the preceding embodiments, the embodiment forms part of a TDMA radio receiving apparatus, and in this embodiment, a local oscillator control signal generating section 612 generates a local oscillator control signal whose level determines the oscillation frequency of the local oscillator of the radio receiving apparatus. The frequency offset estimation section 613 of this embodiment differs from the frequency offset estimation section 609 of the preceding embodiment, in that with this embodiment, the frequency offset estimation section produces (scalar) values which directly represent the amount of frequency offset of the local oscillator frequency. These values are supplied to the local oscillator control signal generating section 612, which accordingly compensates the local oscillator frequency. The local oscillator frequency is thereby adjusted such as to substantially eliminate any phase rotation of the symbols expressed by the quadrature baseband signal. Hence, this embodiment can achieve a similar effect to that of the preceding embodiment.

An eighth embodiment of the invention will be described referring to the block diagram of FIG. 15. The function of this embodiment is to derive a symbol timing reference signal 806 which is stable in frequency, is synchronized with the symbol intervals of the digital quadrature baseband signals 401, and defines (e.g. by executing an L level to H level transition) suitable symbol discrimination time points for use in data demodulation, i.e. time points which are respectively located at the center of each symbol interval within the digital quadrature baseband signals. As described above referring to FIG. 11, symbol discrimination time points are each substantially accurately defined midway between the start and end points of pulses that are obtained by threshold detection of the correlation signal derived by a data correlation circuit according to the present invention, since the phase accuracy of such a correlation signal is substantially unaffected by a phase rotation of the quadrature baseband signals. This embodiment makes use of that fact.

Figure 15:
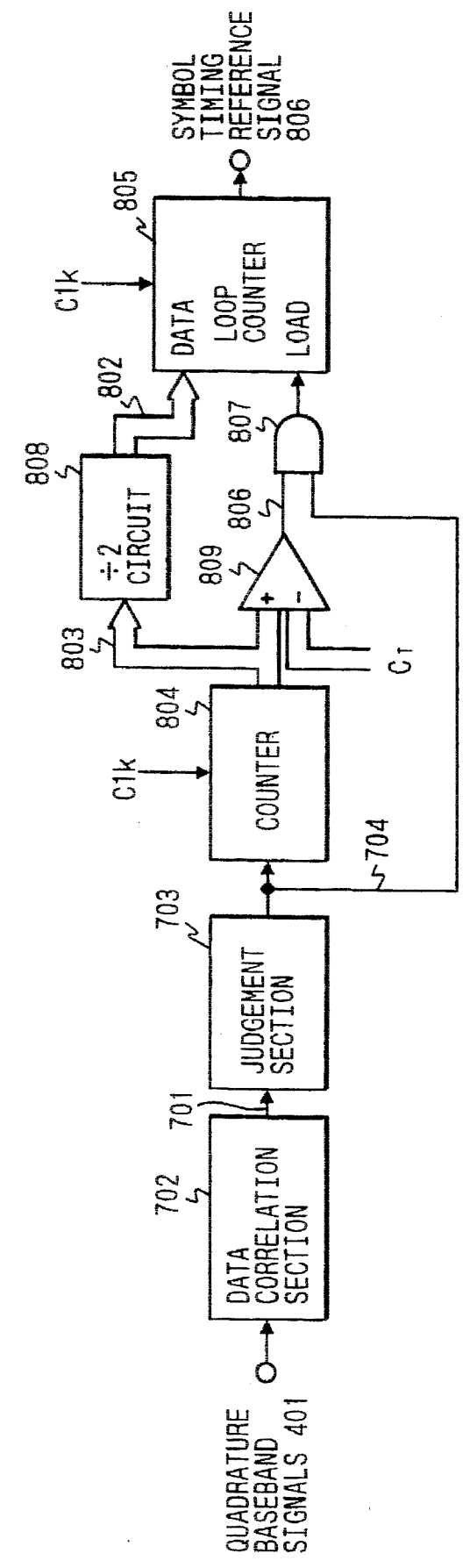
FIG. 15 is a block system diagram of an embodiment of a symbol timing reference signal generating apparatus according to the present invention, synchronized with a correlation signal.

In FIG. 15, the digital quadrature baseband signals 401 are supplied to a correlation section 702, which can be configured as described hereinabove for any of the first, second or third embodiments, to thereby obtain a correlation signal 701. The correlation signal 701 is supplied to a judgement section 703, which executes threshold level comparison to obtain a level-detected correlation signal (i.e. consisting of one binary pulse in each frame period). The widths of these pulses will vary in a random manner, due to the effects of noise and varying radio reception conditions, and the pulses may occasionally be omitted from some of the frame periods. The threshold-detected correlation signal 704 is supplied to a counter 804 and to one input of an AND gate 807. The counter 804 counts up in synchronism with the aforementioned operating clock, i.e. the count value therein is incremented in each sample period. The count value attained by the counter 804 is supplied to a divide-by-two circuit 808 which produces an output data value that is substantially equal to one half of the count value in the counter 804. That output data value from the divide-by-two circuit 808 is applied to a Data input of a loop counter 805, which is a presettable counter, while the output of the AND gate 807 is applied to a Load input of the loop counter 805. The count value in the counter 804 is also supplied to a data comparator 809, to be compared with a threshold data value $C_T$, and the output of the data comparator 809 is applied to the other input of the AND gate 807.

The counter 804 is controlled by the threshold-detected correlation signal such that, so long as the threshold-detected correlation signal is at the L logic level, the counter 804 is held at a count value of zero. When the threshold-detected correlation signal 704 changes to the H level, the counter 804 is enabled to count successive periods of the operating clock signal Clk, until the threshold-detected correlation signal returns to the L level.

The loop counter 805 also counts in synchronism with the operating clock signal Clk. So long as the Load input of the loop counter 805 remains fixed at the L or H level, the loop counter 805 cyclically counts up from zero to a maximum count value, returns to zero, and so on, with the period between transitions from maximum count to zero being equal to the symbol period. When the input signal to the Load terminal changes from the H to the L level, the output data value from the divide-by-two circuit 808 is loaded into the loop counter 805, and counting then begins from that value as an initial value.

During each frame period, the operation of the apparatus of FIG. 15 is as follows. When the level of the correlation signal 701 rises above the threshold value that is set by the judgement section 703, the level-detected correlation signal goes from the L to the H level, whereupon the counter 804 begins to count up. If the count value exceeds the minimum value that is established as the threshold value $C_T$ then the output of the AND gate 807 goes from the L to the H level. When the level-detected correlation signal returns from the H to the L level, the output of the AND gate 807 goes from the H to L level, at which time the output data value from the AND gate 807 (i.e. ½ of the count value in the counter 804) is loaded into the loop counter 805, then the counter 804 returns to a count of zero. The loop counter 805 thus begins counting from an initial count value that is one half of the count value reached by the counter 804 while the level-detected correlation signal was above the correlation threshold level.

Figure 16:
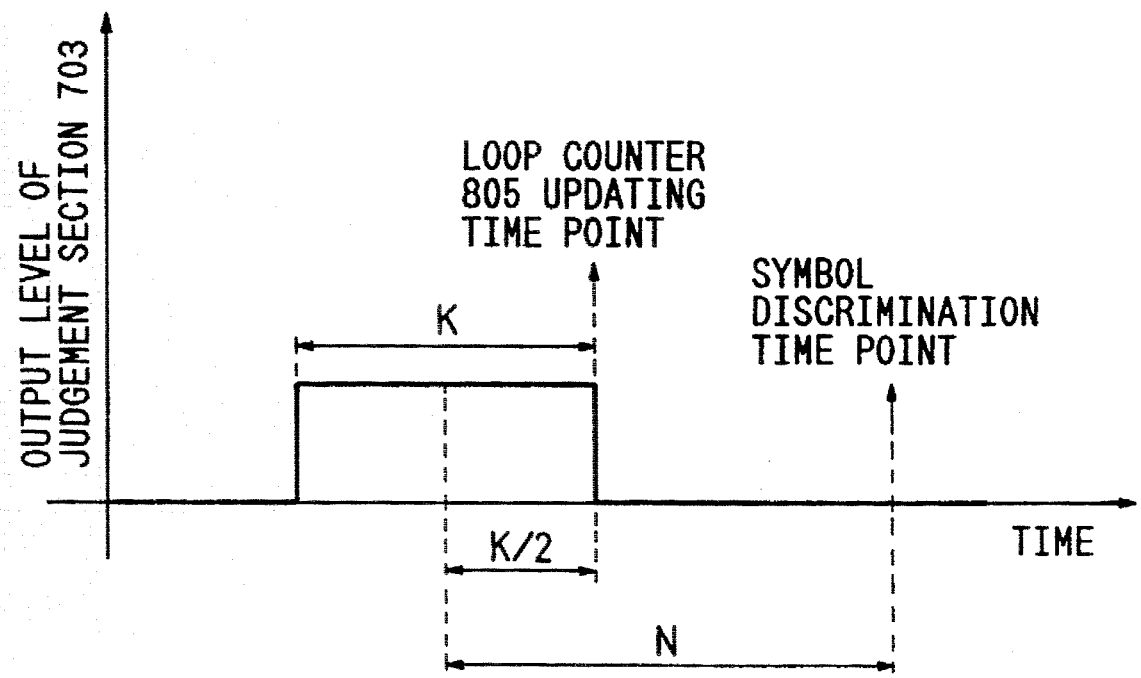
FIG. 16 is a timing diagram for illustrating the operation of the embodiment of FIG. 15 during one frame interval.

The effect achieved can be understood from the timing diagram of FIG. 16, which illustrates the operation during one frame period. The count value reached by the counter 804 while the level-detected correlation signal is above the correlation threshold level is designated as K, while the maximum count value of the loop counter 605 is designated as M. Since, when the counter 804 reaches the count value K the loop counter 605 begins counting from the initial value K/2, it can be understood that the loop counter 605 will reach its maximum count value N at a time point that is identical to the time point which would be reached if the loop counter 605 had started counting from zero at a point midway within a pulse of the threshold-detected correlation signal. Thus, the loop counter 605 reaches its maximum count value at a time point which substantially coincides with a symbol discrimination time point. The loop counter 605 thereafter cyclically counts from zero to N, until a new value of K/2 is loaded therein.

So long as the duration of each pulse of the level-detected correlation signal 704 is sufficiently long in each frame period, (i.e. the threshold value $C_T$ is exceeded) the above operation will successively recur in each frame period. If during one of more sequential frame intervals the threshold value $C_T$ is not exceeded then the loop counter 605 will continue to cyclically count from zero to N throughout each of such frame intervals, thereby continuing to define the successive symbol discrimination time points. This embodiment therefore provides a highly stable symbol timing reference signal, for use in demodulating the digital quadrature baseband signals.

The divide-by-two circuit 808 is preferably configured such that if the final count value K of the counter 804 is an odd number, then the quotient that results from division by two is rounded up to the nearest integer before loading into the loop counter 805, whereas if the value of K is even, then the quotient (or the quotient incremented by 1) is used directly.

From the above description of the embodiments, it can be understood that the present invention provides an improved frame synchronizing apparatus for a radio receiving apparatus of a digital radio communications system, whereby a correlation signal, and hence a frame synchronizing signal and symbol timing reference signal, can be generated with a high degree of phase accuracy.

What is claimed is:

1. A frame synchronizing apparatus for a receiving apparatus of a digital data communications radio system in which data are transmitted as symbols by quadrature modulation of a carrier, arranged in time-multiplexed frames each including a fixed symbol sequence, said receiving apparatus including means for demodulating a received radio signal to obtain quadrature baseband signals expressing said symbols, sampling means for sampling said quadrature baseband signals in successive sample periods to obtain respective received vector values, said frame synchronizing apparatus including a data correlation circuit for producing a correlation signal synchronized with occurrences of said fixed symbol sequence, comprising:

vector difference value generating means for deriving respective received vector difference values between successive pairs of said received vector values, said pairs being mutually separated by one symbol period;

vector normalization means for converting said received vector difference values to respective normalized received vector difference values;

known vector difference value generating means for generating a sequence of normalized known vector difference values, expressing respective vector differences between successive pairs of symbols of said fixed symbol sequence;

means for generating successive sequences of said normalized received vector difference values in respective ones of said sampling periods, each sequence comprising an identical number of values to that of said normalized known vector difference value sequence, said normalized received vector difference values of each sequence being successively mutually separated by one symbol period; and correlation derivation means for deriving successive degrees of correlation between said normalized known vector difference value sequence and said normalized received vector difference value sequences, to thereby derive said correlation signal.

2. A frame synchronizing apparatus for a receiving apparatus of a digital data communications radio system in which data are transmitted as symbols by quadrature modulation of a carrier, arranged in time-multiplexed frames each including a fixed symbol sequence, said receiving apparatus including means for demodulating a received radio signal to obtain quadrature baseband signals expressing said symbols, and sampling means for sampling said quadrature baseband signals in successive sample periods to obtain respective received vector values, said frame synchronizing apparatus including a data correlation circuit for producing a correlation signal synchronized with occurrences of said fixed symbol sequence, comprising:

vector difference value generating means for deriving respective received vector difference values between successive pairs of said received vector values, said pairs being mutually separated by one symbol period;

vector normalization means for converting said received vector difference values to respective normalized received vector difference values;

known vector difference value generating means for generating a sequence of normalized known vector difference values, expressing respective vector differences between successive pairs of symbols of said fixed symbol sequence;

shift register means (404*a*), and means for shifting said normalized received vector difference values into said shift register means in successive ones of said sample periods, with a sequence of said normalized received vector difference values, respectively mutually separated by an amount equivalent to one symbol period and identical in number to said normalized known vector difference values, being outputted in parallel from said shift register means in each of said sampling periods; and correlation signal derivation means (404*b*, 404*c*, 404*d*) operating on each said normalized received vector difference value sequence and said known vector difference value sequence to derive respective amplitude values of said correlation signal, said values varying in accordance with a degree of correlation between said normalized received vector difference values and said normalized known vector difference values.

3. A frame synchronizing apparatus for a receiving apparatus of a digital data communications radio system in which data are transmitted as symbols by quadrature modulation of a carrier, arranged in time-multiplexed frames each including a fixed symbol sequence, said receiving apparatus including means for demodulating a received radio signal to obtain quadrature baseband signals expressing said symbols, and sampling means for sampling said quadrature baseband signals in successive sample periods to obtain respective received vector values, said frame synchronizing apparatus including a data correlation circuit for producing a correlation signal synchronized with occurrences of said fixed symbol sequence, comprising:

vector difference value generating means (407) responsive to said received vector values for deriving respective received vector difference values between successive pairs of said received vector values, said pairs being each mutually separated by one symbol period, and for outputting in parallel a sequence of said received vector difference values in each of said sample periods;

vector normalization means (408) for converting each said received vector difference value sequence from said vector difference value generating means to a normalized received vector difference value sequence;

known vector difference generating means (405) for generating in parallel a set of normalized vector difference values between successive pairs of symbols of said known symbol sequence, as a normalized known vector difference value sequence; and correlation signal derivation means (409) operating on each said received vector difference value sequence and said known vector difference value sequence to derive respective amplitude values of said correlation signal.

4. A frame synchronizing apparatus according to claim 1, 2 or 3, further comprising means (503) for comparing said correlation signal with a predetermined threshold value to obtain a level-detected correlation signal, said frame synchronizing apparatus including frame synchronizing means for generating a frame synchronizing signal, and said level-detected correlation signal being supplied as a timing reference signal to said frame synchronizing means for thereby synchronizing said frame synchronizing signal to have a repetition period which is an average of a repetition period of time points at which said threshold value is exceeded.

5. A frame synchronizing apparatus according to claim 1, 2 or 3, wherein each operation of deriving a vector difference value consists of deriving the complex conjugate of a first vector value and executing vector multiplication of a second vector value by said complex conjugate.

6. A frame synchronizing apparatus according to claim 5, wherein said quadrature modulation consists of $\pi/4$ quadrature phase shift keying modulation, and wherein said normalization of vector values is effected by conversion of respective vector lengths expressed by said vector values to 1.

7. A frame synchronizing apparatus for a receiving apparatus of a digital data communications radio system in which data are transmitted as symbols by quadrature modulation of a carrier, arranged in time-multiplexed frames each including a fixed symbol sequence, said receiving apparatus including means for demodulating a received radio signal to obtain quadrature baseband signals expressing said symbols, sampling means for sampling said quadrature baseband signals in successive sample periods to obtain respective received vector values, and a data correlation circuit for producing a correlation signal as a reference timing signal for said frame synchronizing apparatus;

wherein said data correlation circuit comprising vector difference value generating means (605) for deriving respective received vector difference values between successive pairs of said vectors, said pairs being each mutually separated by one symbol period, for converting said received vector difference values to respective normalized received vector difference values and for generating successive sequences of said normalized vector difference values, known vector difference generating means (604) for generating a sequence of normalized known vector difference values, said known vector difference values expressing respective vector differences between successive pairs of symbols of said known symbol sequence, and data correlation means for operating on said received vector difference value sequences and said known vector difference value sequence to derive a correlation signal synchronized with occurrences of said fixed symbol sequence;

wherein said frame synchronizing apparatus further includes a frequency offset compensation circuit comprising:

frequency offset estimating means (609) for deriving successive values each expressing an amount and direction of estimated frequency offset of a local oscillator of said radio receiver with respect to a received carrier frequency, by executing calculations each based on said normalized received vector difference value and known vector difference value sequences in conjunction with a precedingly calculated value of said estimated frequency offset; and phase compensation means (610) for for executing respective amounts of phase shift of said received vector values in accordance with said estimated frequency offset, to obtain successive compensated received vector values;

wherein said frequency offset estimating means (609) is controlled by said correlation signal (406) to calculate updated values of said estimated frequency offset only at time points when an amplitude of said correlation signal exceeds a predetermined threshold value.

8. A frame synchronizing apparatus for a receiving apparatus of a digital data communications radio system in which data are transmitted as symbols by quadrature modulation of a carrier, arranged in time-multiplexed frames each including a fixed symbol sequence, said receiving apparatus including means for demodulating a received radio signal to obtain quadrature baseband signals expressing said symbols, sampling means for sampling said quadrature baseband signals in successive sample periods to obtain respective received vector values, and a data correlation circuit for producing a correlation signal as a reference timing signal for said frame synchronizing apparatus, said data correlation apparatus comprising received vector difference value generating means (605) coupled to successively receive said vectors, for deriving respective received vector difference values between successive pairs of said vectors, said pairs being each mutually separated by one symbol period, and for converting said received vector difference values to respective normalized received vector difference values and for generating successive sequences of said normalized vector difference values, known vector difference generating means (604) for generating a sequence of normalized known vector difference values, said known vector difference values expressing respective vector differences between successive pairs of symbols of said known symbol sequence, and data correlation means for operating on said received vector difference value sequences and said known vector difference value sequence to derive a correlation signal synchronized with occurrences of said fixed symbol sequence;

wherein said frame synchronizing apparatus further includes a frequency offset compensation circuit comprising:

frequency offset estimating means (613) for deriving a value of estimated frequency offset expressing an amount and direction of an estimated frequency offset of a local oscillator of said radio receiving apparatus with respect to a received carrier frequency, by executing calculations each based on said normalized received vector difference value and known vector difference value sequences in conjunction with a precedingly calculated value of said estimated frequency offset; and local oscillator control signal generating means (612) for generating a local oscillator control signal varying in accordance with said estimated frequency offset value, and means for applying said local oscillator control signal to execute frequency compensation of a local oscillator generating circuit of said receiving apparatus;

said frequency offset estimating means (613) being controlled by said correlation signal (406) to derive updated values of said estimated frequency offset only at time points when an amplitude of said correlation signal exceeds a predetermined threshold value.

9. A frame synchronizing apparatus for a receiving apparatus of a digital data communications radio system which transmits data arranged in time-multiplexed data frames each including a fixed data sequence, with symbols representing said data being transmitted by quadrature modulation of a carrier, said receiving apparatus including means for demodulating a received radio signal to obtain quadrature baseband signals expressing said symbols and sampling means for sampling said quadrature baseband signals in successive sample periods to obtain respective vectors each represented by a concurrent pair of digital data, and a data correlation circuit functioning to detect occurrences in said quadrature baseband signals of a fixed symbol sequence corresponding to said fixed data sequence for thereby generating a correlation signal as successive correlation signal pulses in respective intervals of said data frames, said data correlation circuit comprising vector difference value generating means (605) coupled to successively receive said vectors, for deriving respective received vector difference values between successive pairs of said vectors, said pairs being each mutually separated by one symbol period, for converting said received vector difference values to respective normalized received vector difference values and generating successive sequences of said normalized vector difference values, known vector difference generating means (604) for generating normalized known vector difference values between successive pairs of symbols of said known symbol sequence as a known vector difference value sequence, and data correlation means for operating on said normalized received vector difference value sequences and said known vector difference value sequence to derive a correlation signal synchronized with occurrences of said fixed symbol sequence;

wherein said frame synchronizing apparatus includes a symbol reference timing signal derivation apparatus comprising:

judgement means (703) for generating level-detected correlation signal pulses defining respective intervals in which said correlation signal exceeds a predetermined threshold value;

means (804) for deriving, for each of said level-detected correlation signal pulses, a number of sample intervals corresponding to the duration of said each level-detected correlation signal pulse;

means (808) for deriving, for each of said level-detected correlation signal pulses, a value which is substantially equal to one half of said number of sample intervals;

loop counter means (805) for periodically counting from a minimum to a maximum count value with a period which is identical to said symbol period, to thereby produce said symbol timing reference signal; and means for presetting said loop counter means, as an initial count value immediately following each of said level-detected correlation signal pulses, to said value which is substantially equal to half of said number of sample intervals.

10. A frame synchronizing apparatus according to claim 9, further comprising:

means (809) for monitoring each of said correlation signal pulses, to produce a detection signal (806) when a duration of said each correlation signal pulse exceeds a predetermined number of said sample intervals; and means (807) controlled by said detection signal for selectively enabling and inhibiting said presetting of said loop counter means.

11. A frame synchronizing apparatus according to claim 9, wherein said means for deriving said value which is substantially equal to one half of said number of sample intervals comprises means which functions when said number of sample intervals corresponding to the duration of a level-detected correlation signal pulse is an even number, to set said value as one half of said number of sample intervals, or as one half of said number of sample intervals incremented by 1, and which functions when said number of sample intervals is an odd number, to set said value as one half of said number of sample intervals rounded up to the nearest integer.

12. A frame synchronizing apparatus according to claim 2, further comprising means (503) for comparing said correlation signal with a predetermined threshold value to obtain a level-detected correlation signal, said frame synchronizing apparatus including frame synchronizing means for generating a frame synchronizing signal, and said level-detected correlation signal being supplied as a timing reference signal to said frame synchronizing means for thereby synchronizing said frame synchronizing signal to have repetition period which is an average of a repetition period of time points at which said threshold value is exceeded.

13. A frame synchronizing apparatus according to claim 3, further comprising means (503) for comparing said correlation signal with a predetermined threshold value to obtain a level-detected correlation signal, said frame synchronizing apparatus including frame synchronizing means for generating a frame synchronizing signal, and said level-detected correlation signal being supplied as a timing reference signal to said frame synchronizing means for thereby synchronizing said frame synchronizing signal to have a repetition period which is an average of a repetition period of time points at which said threshold value is exceeded.

14. A frame synchronizing apparatus according to claim 2, wherein each operation of deriving a vector difference value consists of deriving the complex conjugate of a first vector value and executing vector multiplication of a second vector value by said complex conjugate.

15. A frame synchronizing apparatus according to claim 3, wherein each operation of deriving a vector difference value consists of deriving the complex conjugate of a first vector value and executing vector multiplication of a second vector value by said complex conjugate.

* * * * *